US012666680B2

(12) United States Patent
Yu et al.

(10) Patent No.: US 12,666,680 B2
(45) Date of Patent: Jun. 23, 2026

(54) SEMICONDUCTOR DEVICE AND METHOD OF FABRICATING THE SAME

(71) Applicant: Samsung Electronics Co., Ltd., Suwon-si (KR)

(72) Inventors: Hyun-Kwan Yu, Suwon-si (KR); Sunyoung Lee, Suwon-si (KR); Hyunwoo Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 417 days.

(21) Appl. No.: 18/390,018

(22) Filed: Dec. 20, 2023

(65) Prior Publication Data

US 2024/0234543 A1 Jul. 11, 2024

(30) Foreign Application Priority Data

Jan. 5, 2023 (KR) ........................ 10-2023-0001902
Mar. 27, 2023 (KR) ........................ 10-2023-0039727

(51) Int. Cl.
H10D 64/01 (2025.01)
H10D 62/13 (2025.01)
H10D 64/66 (2025.01)

(52) U.S. Cl.
CPC ......... H10D 64/018 (2025.01); H10D 62/151 (2025.01); H10D 64/679 (2025.01)

(58) Field of Classification Search
CPC .. H10D 64/018; H10D 64/679; H10D 64/017; H10D 64/021; H10D 64/516; H10D 62/151; H10D 62/822; H10D 62/121; H10D 30/797; H10D 30/014; H10D 30/43; H10D 30/6735; H10D 30/6757
See application file for complete search history.

(56) References Cited

U.S. PATENT DOCUMENTS

| | | | |
|---|---|---|---|
| 11,289,584 B2 | 3/2022 | Wu et al. | |
| 11,502,183 B2 | 11/2022 | Yao et al. | |
| 2018/0374930 A1 | 12/2018 | Bergendahl et al. | |
| 2019/0157444 A1* | 5/2019 | Yang ...................... | B82Y 10/00 |
| 2021/0036122 A1* | 2/2021 | Wong ................. | H10D 30/6739 |
| 2021/0126102 A1* | 4/2021 | Nakjin .............. | H10D 30/6739 |
| 2021/0202758 A1 | 7/2021 | Yeong et al. | |

(Continued)

FOREIGN PATENT DOCUMENTS

KR 10-2024-0086277 A 6/2024

*Primary Examiner* — Marlon T Fletcher
*Assistant Examiner* — Christina A Sylvia
(74) *Attorney, Agent, or Firm* — Muir Patent Law, PLLC

(57) ABSTRACT

A semiconductor device comprises a substrate including an active pattern, a channel pattern on the active pattern, a source/drain pattern on the channel pattern, a gate electrode on the channel pattern, and a gate dielectric layer between the channel pattern and the gate electrode. The gate electrode includes an inner electrode between neighboring first and second semiconductor patterns. The gate dielectric layer includes a high-k dielectric layer that surrounds the inner electrode of the gate electrode and an inner spacer on the high-k dielectric layer. The inner spacer includes a first horizontal part between the high-k dielectric layer and the second semiconductor pattern, a first vertical part between the high-k dielectric layer and the source/drain pattern, and a first corner part that connects the first horizontal part to the first vertical part.

20 Claims, 36 Drawing Sheets

(56)     References Cited

U.S. PATENT DOCUMENTS

| | | | |
|---|---|---|---|
| 2021/0242328 A1 | 8/2021 | Cheng et al. | |
| 2021/0313452 A1 | 10/2021 | Cheng et al. | |
| 2021/0384296 A1 | 12/2021 | Greene et al. | |
| 2022/0037506 A1 | 2/2022 | Chen et al. | |
| 2022/0140151 A1 | 5/2022 | Yeong et al. | |
| 2022/0149176 A1 | 5/2022 | More et al. | |
| 2022/0238723 A1 | 7/2022 | Jeong et al. | |
| 2022/0238725 A1 | 7/2022 | Chiang et al. | |
| 2022/0285533 A1 | 9/2022 | Lee et al. | |
| 2022/0328648 A1 | 10/2022 | Wong et al. | |
| 2022/0336677 A1 | 10/2022 | Liu et al. | |
| 2022/0367625 A1 | 11/2022 | Liu et al. | |
| 2023/0253449 A1* | 8/2023 | Shin .................... | H10D 62/116 |
| | | | 257/401 |

* cited by examiner

SEMICONDUCTOR DEVICE AND METHOD OF FABRICATING THE SAME

CROSS-REFERENCE TO RELATED APPLICATIONS

This U.S. nonprovisional application claims priority under 35 U.S.C § 119 to Korean Patent Applications No. 10-2023-0001902 filed on Jan. 5, 2023 and No. 10-2023-0039727 filed on Mar. 27, 2023 in the Korean Intellectual Property Office, the disclosures of which are hereby incorporated by reference in their entirety.

BACKGROUND

The present inventive concepts relate to a semiconductor device and a method of fabricating the same, and more particularly, to a semiconductor device including a field effect transistor and a method of fabricating the same.

A typical semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of fabricating semiconductor devices having superior performance while overcoming limitations caused by high integration of the semiconductor devices.

SUMMARY

Some embodiments of the present inventive concepts provide a semiconductor device with improved electrical properties.

Some embodiments of the present inventive concepts provide a method of fabricating a semiconductor device with improved electrical properties.

According to some embodiments of the present inventive concepts, a semiconductor device may comprise: a substrate that includes an active pattern; a channel pattern on the active pattern, wherein the channel pattern includes a plurality of semiconductor patterns that are spaced apart from and vertically stacked on each other; a source/drain pattern connected to the plurality of semiconductor patterns; a gate electrode on the plurality of semiconductor patterns; and a gate dielectric layer between the gate electrode and the plurality of semiconductor patterns. The gate electrode may include an inner electrode between a first semiconductor pattern and a second semiconductor pattern that are adjacent ones of the plurality of semiconductor patterns. The gate dielectric layer may include: a high-k dielectric layer that surrounds the inner electrode of the gate electrode; and an inner spacer on the high-k dielectric layer. The inner spacer may define an inner gate space therein. The high-k dielectric layer and the inner electrode may be provided in the inner gate space. The inner spacer may include: a first horizontal part between the high-k dielectric layer and the second semiconductor pattern; a first vertical part between the high-k dielectric layer and the source/drain pattern; and a first corner part that connects the first horizontal part to the first vertical part. The first horizontal part may have a first thickness in a vertical direction. The first corner part may have a second thickness in the vertical direction. A ratio of the second thickness to the first thickness may be in a range of about 1.1:1 to about 1.5:1.

According to some embodiments of the present inventive concepts, a semiconductor device may comprise: a substrate that includes an active pattern; a channel pattern on the active pattern, wherein the channel pattern includes a plurality of semiconductor patterns that are spaced apart from and vertically stacked on each other; a first source/drain pattern and a second source/drain pattern on opposite sides of the channel pattern; a gate electrode on the channel pattern; and a gate dielectric layer between the channel pattern and the gate electrode. An inner region may be defined between the first source/drain pattern and the second source/drain pattern and between a first semiconductor pattern and a second semiconductor pattern that are adjacent ones of the plurality of semiconductor patterns. The gate dielectric layer may include: an inner spacer that partially fills the inner region and defines an inner gate space in the inner spacer; and an air gap on a corner part of the inner spacer. The gate electrode may include an inner electrode in the inner gate space.

According to some embodiments of the present inventive concepts, a semiconductor device may comprise: a substrate that includes an active pattern; a device isolation layer that defines the active pattern; a channel pattern and a source/drain pattern on the active pattern, the channel pattern including a plurality of semiconductor patterns that are spaced apart from each other and vertically stacked on each other; a gate electrode on the plurality of semiconductor patterns; a gate dielectric layer between the gate electrode and the plurality of semiconductor patterns; a gate spacer on a sidewall of the gate electrode; a gate capping pattern on a top surface of the gate electrode; an interlayer dielectric layer on the gate capping pattern; an active contact that penetrates the interlayer dielectric layer and is electrically connected to the source/drain pattern; a metal-semiconductor compound layer between the active contact and the source/drain pattern; a gate contact that penetrates the interlayer dielectric layer and the gate capping pattern and is electrically connected to the gate electrode; and a first metal layer on the interlayer dielectric layer. The first metal layer may include: a power line; and a plurality of first wiring lines electrically connected to the active contact and the gate contact. The gate electrode may include an inner electrode between a first semiconductor pattern and a second semiconductor pattern that are adjacent ones of the plurality of semiconductor patterns. The source/drain pattern may include a protrusion that protrudes toward the inner electrode. The gate dielectric layer may include: a high-k dielectric layer that surrounds the inner electrode of the gate electrode; and an inner spacer on the high-k dielectric layer. The inner spacer may include: a horizontal part between the high-k dielectric layer and the second semiconductor pattern; a vertical part between the high-k dielectric layer and the protrusion; and a corner part that connects the horizontal part to the vertical part. A first side of the vertical part may have a concave profile that corresponds to the protrusion. A second side of the vertical part may have a flat profile parallel to a vertical direction.

According to some embodiments of the present inventive concepts, a method of fabricating a semiconductor device may comprise: forming on a substrate a stack pattern including active layers and sacrificial layers that are alternately stacked; forming a sacrificial pattern on the stack pattern; using the sacrificial pattern as a mask to etch the stack pattern to form a first recess and a second recess on opposite sides of the sacrificial pattern; forming a first source/drain pattern and a second source/drain pattern in the first recess and the second recess, respectively, wherein semiconductor patterns are formed from the active layers between the first and second source/drain patterns; removing the sacrificial pattern and the sacrificial layers to expose the semiconductor patterns; and sequentially forming a gate dielectric layer and a gate electrode on the exposed semiconductor patterns. The semiconductor patterns may include a first semiconductor pattern and a second semiconductor pattern that are adjacent to each other. The step of forming the gate dielectric layer may include: performing a first process to deposit a first dielectric layer in an inner region between the first source/drain pattern and the second source/drain pattern and between the first semiconductor pattern and the second semiconductor pattern; performing a second process to selectively wet-etch the first dielectric layer; repeatedly performing the first and second processes to form an inner spacer in the inner region, wherein the inner spacer provides an inner gate space in the inner spacer; and forming a high-k dielectric layer in the inner gate space.

BRIEF DESCRIPTION OF DRAWINGS

FIGS. 7A, 7B, 8A, 8B, 9A-12A, 9B-12B, and 9C-12C illustrate cross-sectional views showing a method of fabricating a semiconductor device according to some embodiments of the present inventive concepts.

DETAILED DESCRIPTION OF EMBODIMENTS

Figure 1:
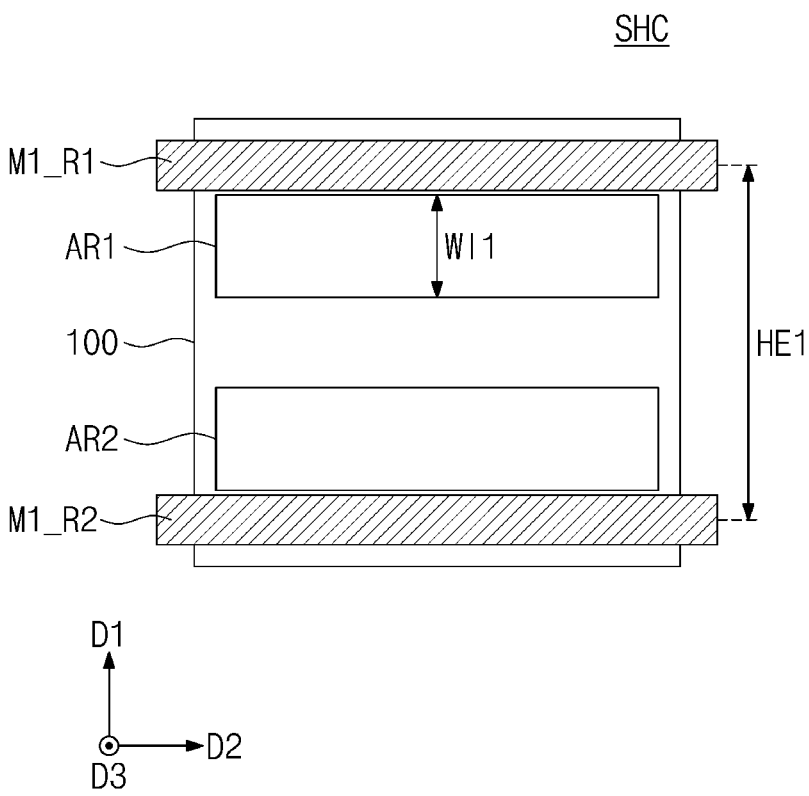
FIGS. 1 to 3 illustrate conceptual views showing logic cells of a semiconductor device according to some embodiments of the present inventive concepts.
Figure 2:
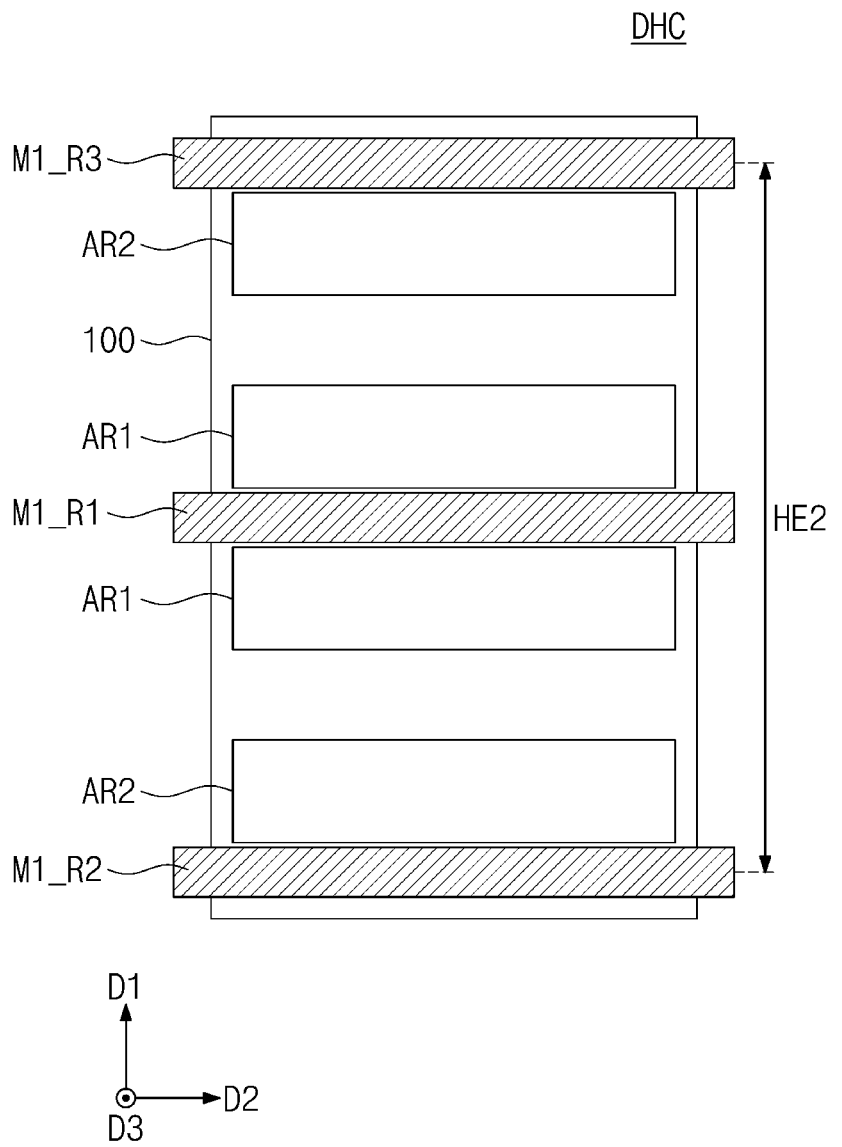
Figure 3:
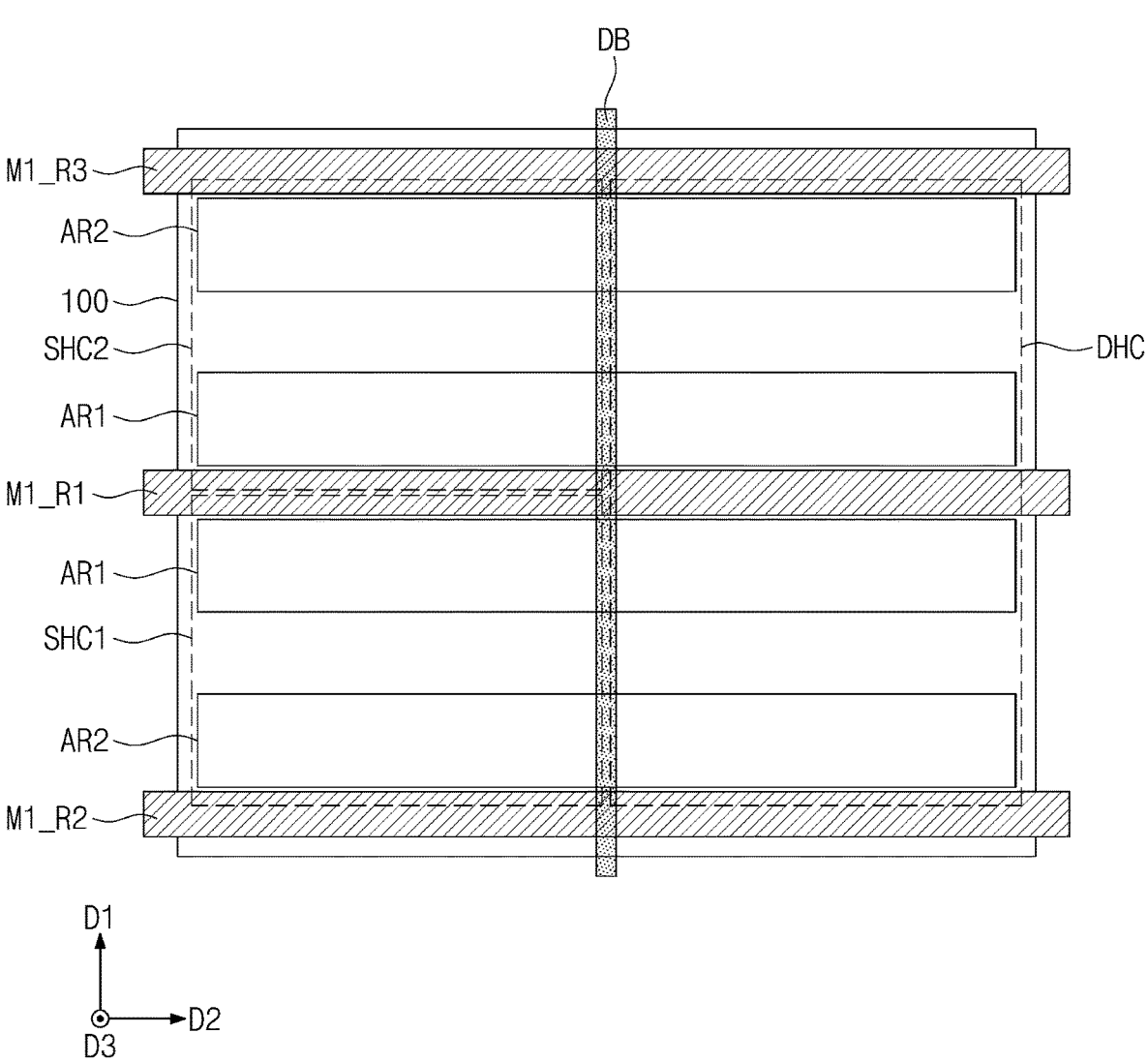

FIGS. 1 to 3 illustrate conceptual views showing logic cells of a semiconductor device according to some embodiments of the present inventive concepts. A semiconductor device as described herein may refer to an integrated circuit, formed on a die from a wafer. For example, a semiconductor device may be a semiconductor chip such as a logic chip or memory chip, or may refer to a package including such a semiconductor chip.

Referring to FIG. 1, a single height cell SHC may be provided. For example, a substrate 100 may be provided thereon with a first power line M1_R1 and a second power line M1_R2. The first power line M1_R1 may be a path for providing a source voltage VSS, for example, a ground voltage. The second power line M1_R2 may be a path for providing a drain voltage VDD, for example, a power voltage.

The single height cell SHC may be defined between the first power line M1_R1 and the second power line M1_R2.

The single height cell SHC may include one first active region AR1 and one second active region AR2. One of the first and second active regions AR1 and AR2 may be a PMOSFET region, and the other of the first and second active regions AR1 and AR2 may be an NMOSFET region. For example, the single height cell SHC may have a complementary metal oxide semiconductor (CMOS) structure provided between the first power line M1_R1 and the second power line M1_R2.

The first and second active regions AR1 and AR2 may have a first width WII in a first direction D1. A first height HE1 may be defined to indicate a length in the first direction D1 of the single height cell SHC. The first height HE1 may be substantially the same as a distance (e.g., pitch) between the first power line M1_R1 and the second power line M1_R2.

The single height cell SHC may constitute one logic cell. In this description, the logic cell may mean a logic device, such as AND, OR, XOR, XNOR, and inverter, that performs a specific function. For example, the logic cell may include transistors for constituting a logic device, and may also include wiring lines that connect the transistors to each other.

Referring to FIG. 2, a double height cell DHC may be provided. For example, a substrate 100 may be provided thereon with a first power line M1_R1, a second power line M1_R2, and a third power line M1_R3. The first power line M1_R1 may be disposed between the second power line M1_R2 and the third power line M1_R3. The third power line M1_R3 may be a path for providing a source voltage VSS.

The double height cell DHC may be defined between the second power line M1_R2 and the third power line M1_R3. The double height cell DHC may include two first active regions AR1 and two second active regions AR2.

One of the two second active regions AR2 may be adjacent to the second power line M1_R2. The other of the two second active regions AR2 may be adjacent to the third power line M1_R3. The two first active regions AR1 may be adjacent to the first power line M1_R1. When viewed in plan view, the first power line M1_R1 may be disposed between the two first active regions AR1.

A second height HE2 may be defined to indicate a length in the first direction D1 of the double height cell DHC. The second height HE2 may be about twice the first height HE1 of FIG. 1. The two first active regions AR1 of the double height cell DHC may be collectively connected together to act as one active region.

In the inventive concepts, the double height cell DHC shown in FIG. 2 may be defined as a multi-height cell. Although not shown, the multi-height cell may include a triple height cell whose cell height is about three times that of the single height cell SHC.

Referring to FIG. 3, a substrate 100 may be provided thereon with a first single height cell SHC1, a second single height cell SHC2, and a double height cell DHC that are two-dimensionally disposed. The first single height cell SHC1 may be disposed between a first power line M1_R1 and a second power line M1_R2. The second single height cell SHC2 may be disposed between the first power line M1_R1 and a third power line M1_R3. The second single height cell SHC2 may be adjacent in a first direction D1 to the first single height cell SHC1.

The double height cell DHC may be disposed between the second power line M1_R2 and the third power line M1_R3.

The double height cell DHC may be adjacent in a second direction D2 to the first and second single height cells SHC1 and SHC2.

A separation structure DB, also described as an isolation structure, may be provided between the first single height cell SHC1 and the double height cell DHC and between the second single height cell SHC2 and the double height cell DHC. The separation structure DB may electrically separate or isolate an active region of the double height cell DHC from an active region of each of the first and second single height cells SHC1 and SHC2. It should be noted that a "height" as described above (e.g., in connection with a single height cell and double height cell) does not refer to a vertical height in a direction perpendicular to a surface of a semiconductor substrate, but rather refers to a height in the D1 direction in connection with the orientation of FIGS. 1-3.

Figure 4:
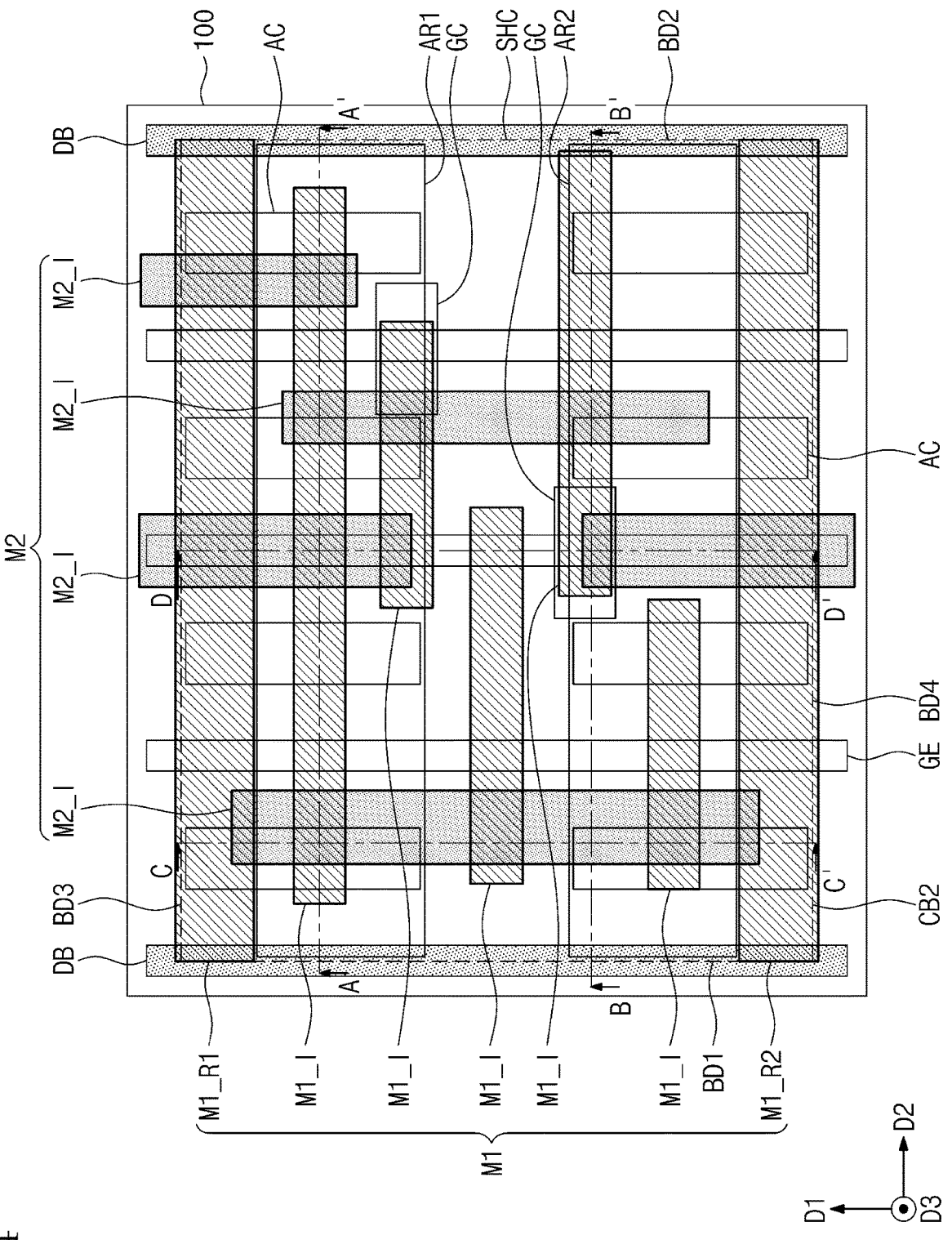
FIG. 4 illustrates a plan view showing a semiconductor device according to some embodiments of the present inventive concepts.
Figure 5A:
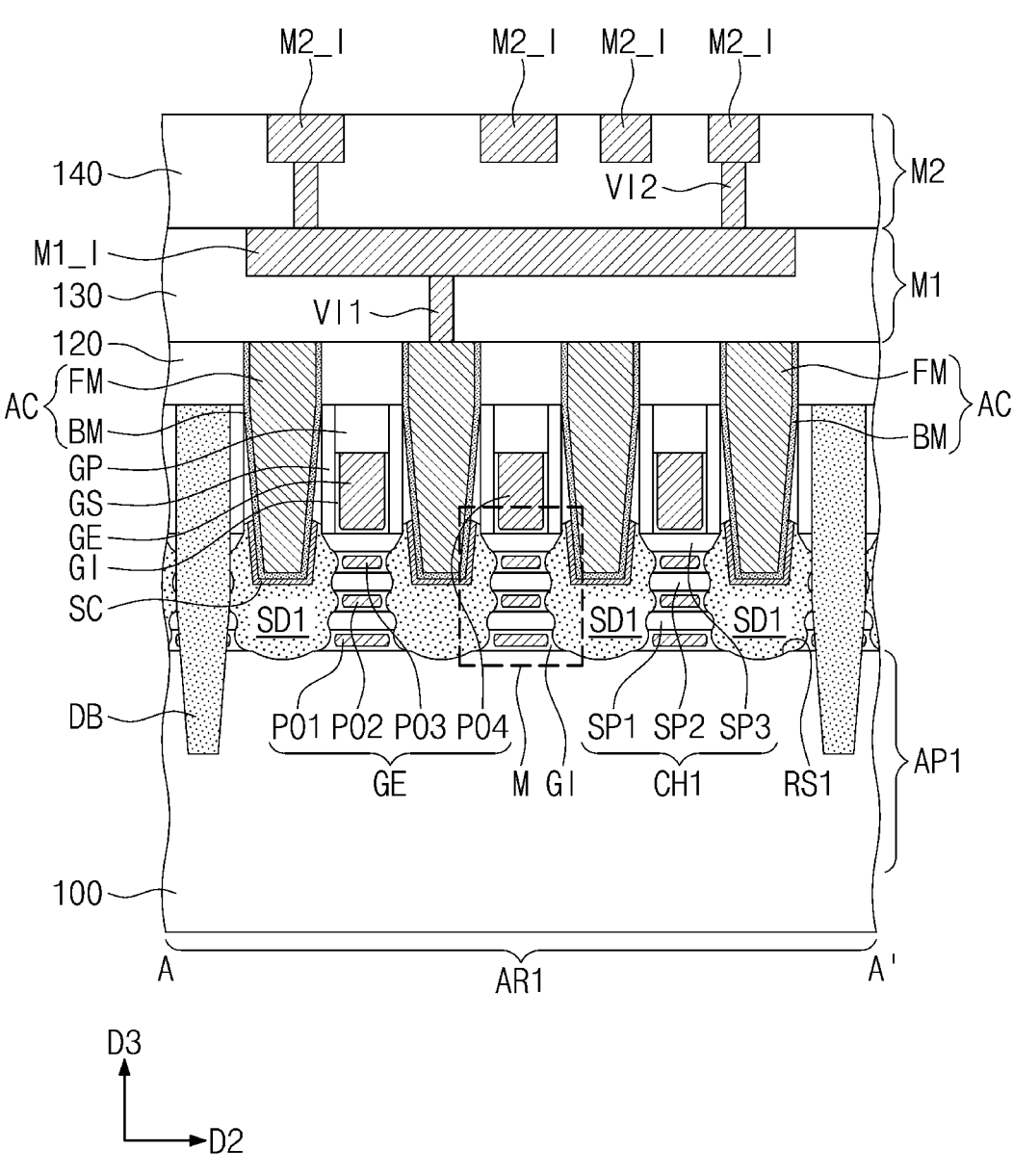
FIGS. 5A, 5B, 5C, and 5D illustrate cross-sectional views respectively taken along lines A-A', B-B', C-C', and D-D' of FIG. 4.
Figure 5B:
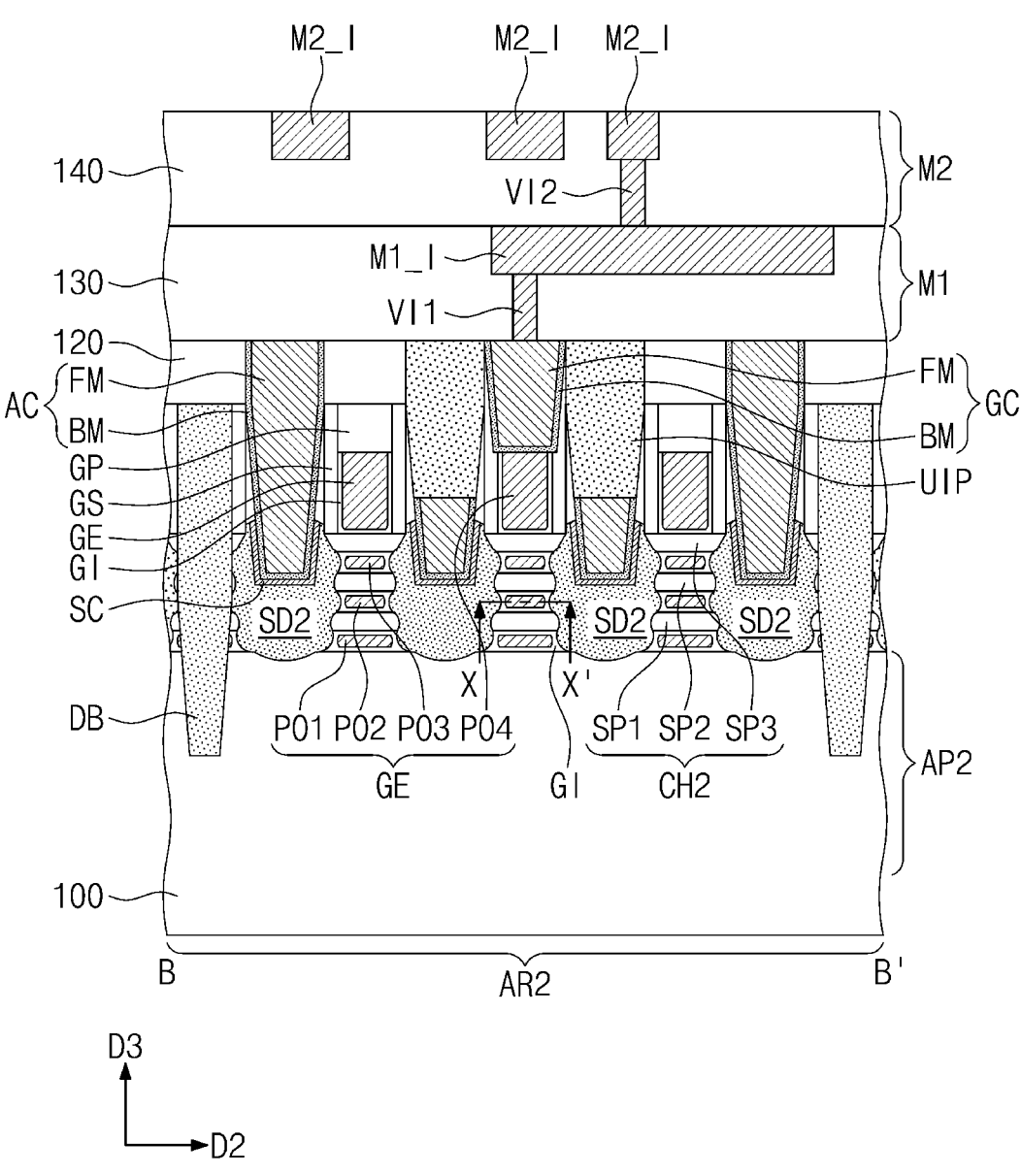
Figure 5C:
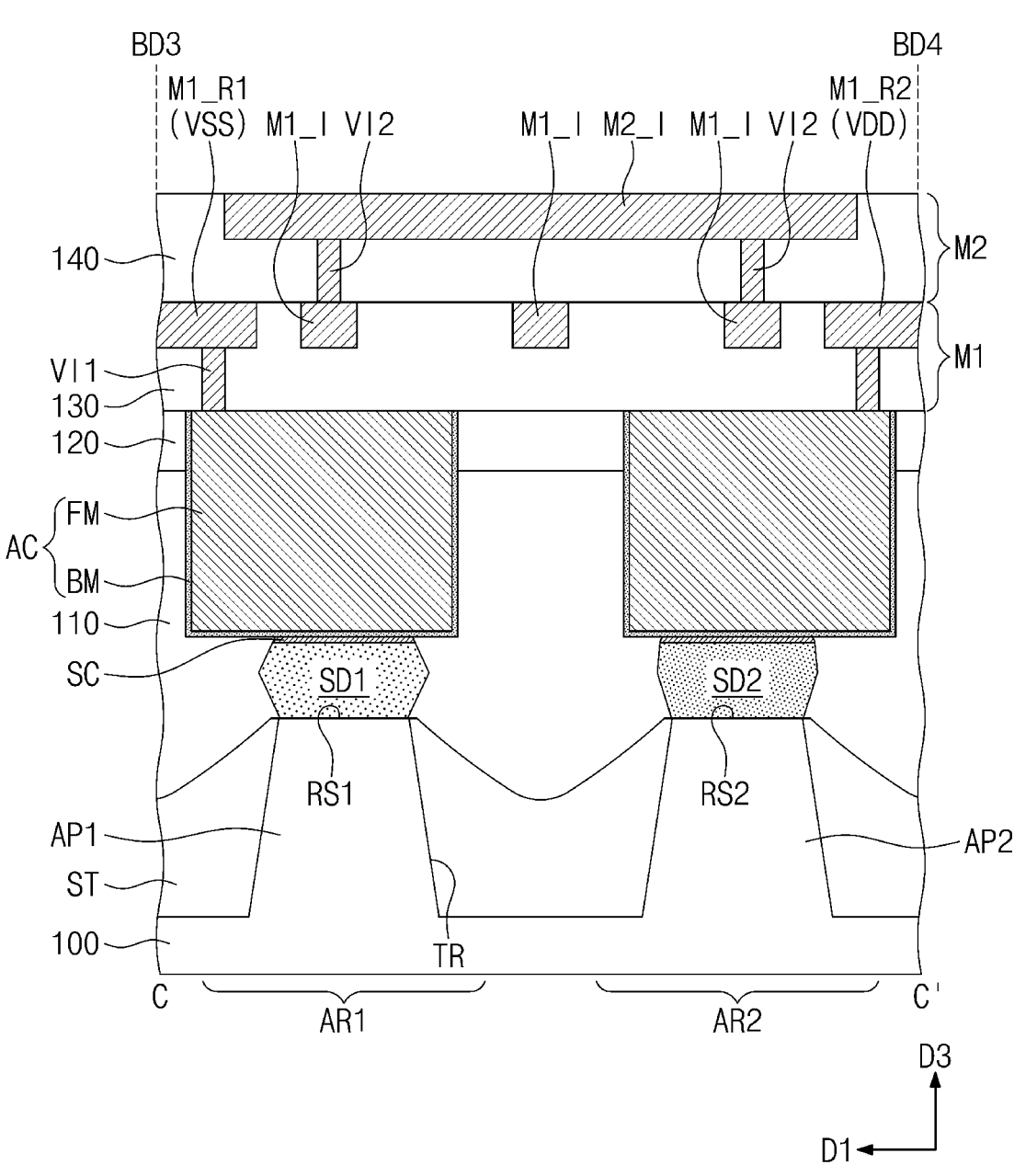

FIG. 4 illustrates a plan view showing a semiconductor device according to some embodiments of the present inventive concepts. FIGS. 5A, 5B, 5C, and 5D illustrate cross-sectional views respectively taken along lines A-A', B-B', C-C', and D-D' of FIG. 4. FIG. 6A illustrates an enlarged view showing an example of section M depicted in FIG. 5A, according to an embodiment. FIG. 6B illustrates an enlarged view showing an example of section M depicted in FIG. 5A, according to an embodiment. FIG. 6C illustrates a plan view showing an example that corresponds to line X-X' of FIG. 5B.

A semiconductor device depicted in FIGS. 4 and 5A to 5D is a detailed example of the single height cell SHC shown in FIG. 1. Referring to FIGS. 4 and 5A to 5D, a single height cell SHC may be provided on a substrate 100. The single height cell SHC may be provided thereon with logic transistors included in a logic circuit. The substrate 100 may be a compound semiconductor substrate or a semiconductor substrate including or formed of silicon, germanium, or silicon-germanium. For example, the substrate 100 may be a silicon substrate.

The substrate 100 may include a first active region AR1 and a second active region AR2. Each of the first and second active regions AR1 and AR2 may extend lengthwise in a second direction D2. An item, layer, or portion of an item or layer described as extending "lengthwise" in a particular direction has a length in the particular direction and a width perpendicular to that direction, where the length is greater than the width. The first active region AR1 may be one of NMOSFET and PMOSFET regions, and the second active region AR2 may be the other of NMOSFET and PMOSFET regions. In some embodiments, the first active region AR1 may be an NMOSFET region, and the second active region AR2 may be a PMOSFET region.

A first active pattern AP1 and a second active pattern AP2 may be defined by a trench TR formed on an upper portion of the substrate 100. The first active pattern AP1 may be provided on the first active region AR1, and the second active pattern AP2 may be provided on the second active region AR2. The first and second active patterns AP1 and AP2 may extend lengthwise in the second direction D2. The first and second active patterns AP1 and AP2 may be vertically protruding portions of the substrate 100.

A device isolation layer ST may be provided on the substrate 100. The device isolation layer ST may fill the trench TR. The device isolation layer ST may include or be a silicon oxide layer. The device isolation layer ST may not cover any of first and second channel patterns CH1 and CH2 which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction (or a third direction D3).

Each of the first, second, and third semiconductor patterns SP1, SP2, and SP3 may be or may include silicon (Si), germanium (Ge), or silicon-germanium (SiGe). For example, each of the first, second, and third semiconductor patterns SP1, SP2, and SP3 may be crystalline silicon.

A plurality of first source/drain patterns SD1 may be provided on the first active pattern AP1. A plurality of first recesses RS1 may be formed on an upper portion of the first active pattern AP1. The first source/drain patterns SD1 may be correspondingly provided in the first recesses RS1. The first source/drain patterns SD1 may be impurity regions of a first conductivity type. The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. The second source/drain patterns SD2 may be correspondingly provided in the second recesses RS2. The second source/drain patterns SD2 may be impurity regions of a second conductivity type. The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first conductivity type of the first source/drain pattern SD1 may be one of n-type and p-type, and the second conductivity type of the second source/drain pattern SD2 may be the other of n-type and p-type. In some embodiments, the first conductivity type may be n-type, and the second conductivity type may be p-type.

The first and second source/drain patterns SD1 and SD2 may be epitaxial patterns formed by a selective epitaxial growth (SEG) process. For example, each of the first and second source/drain patterns SD1 and SD2 may have a top surface higher than that of the third semiconductor pattern SP3. For another example, at least one of the first and second source/drain patterns SD1 and SD2 may have a top surface at substantially the same level as that of a top surface of the third semiconductor pattern SP3.

In some embodiments of the present inventive concepts, the first source/drain patterns SD1 may include or be formed of the same semiconductor element (e.g., Si) as that of the substrate 100. The second source/drain patterns SD2 may include or be formed of a semiconductor element (e.g., SiGe) whose lattice constant is greater than that of a semiconductor element of the substrate 100. Therefore, a pair of second source/drain patterns SD2 may provide the second channel pattern CH2 with compressive stress.

Each of the first and second source/drain patterns SD1 and SD2 may have an uneven embossing shape at a sidewall thereof. For example, each of the first and second source/drain patterns SD1 and SD2 may have a wavy profile at a sidewall thereof. Each of the first and second source/drain patterns SD1 and SD2 may have a sidewall that protrudes horizontally toward first, second, and third inner electrodes PO1, PO2, and PO3 of a gate electrode GE which will be discussed below.

A plurality of gate electrodes GE may be provided to extend lengthwise in a first direction D1, while running across the first and second channel patterns CH1 and CH2. The gate electrodes GE may be arranged at a first pitch in the second direction D2. Each of the gate electrodes GE may vertically overlap the first and second channel patterns CH1 and CH2.

Each gate electrode GE may include a first inner electrode PO1 interposed between the first semiconductor pattern SP1 and the active pattern AP1 or AP2, a second inner electrode PO2 interposed between the first semiconductor pattern SP1 and the second semiconductor pattern SP2, a third inner electrode PO3 interposed between the second semiconductor pattern SP2 and the third semiconductor pattern SP3, and an outer electrode PO4 on the third semiconductor pattern SP3.

Figure 5D:
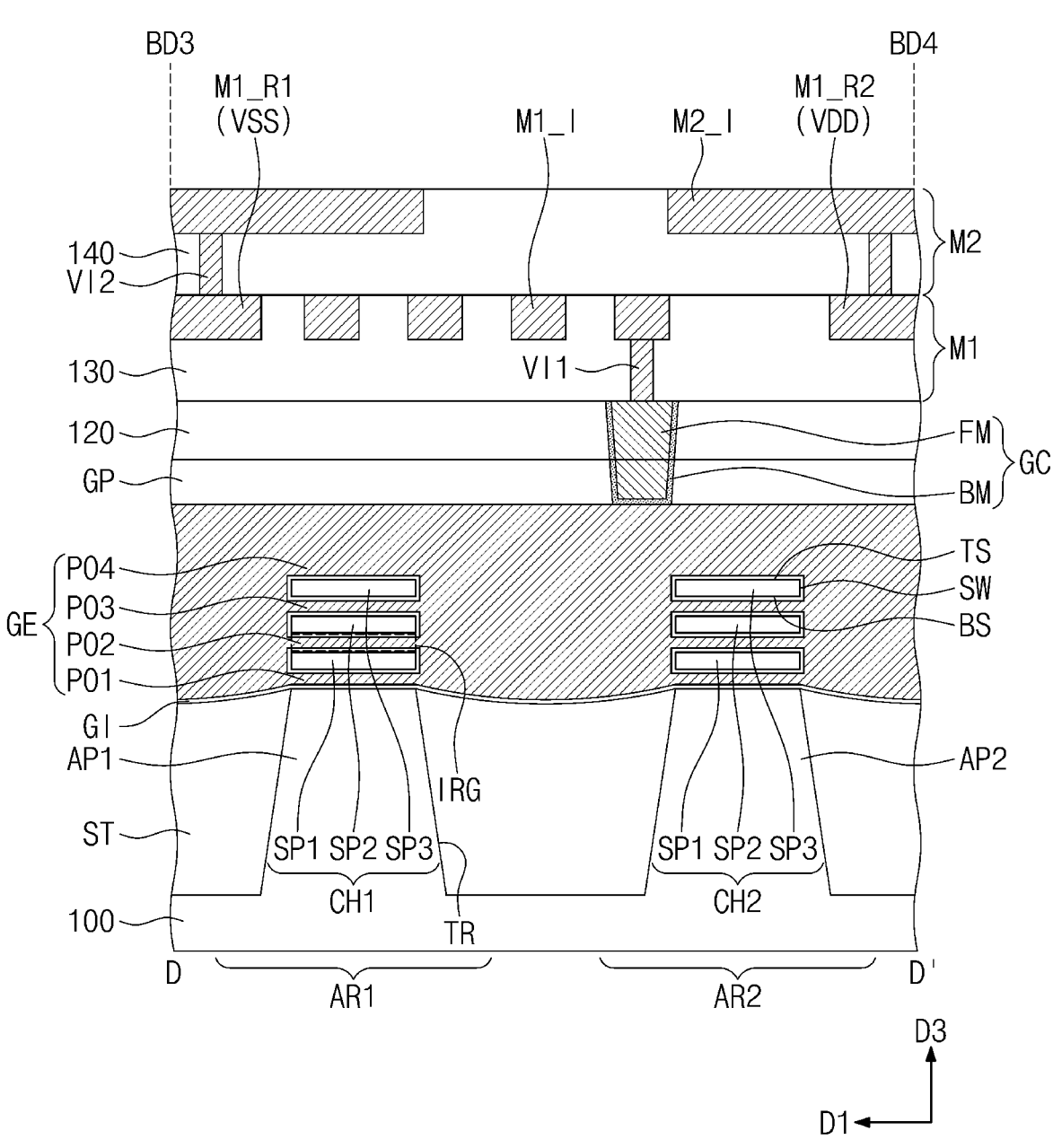
Figure 6A:
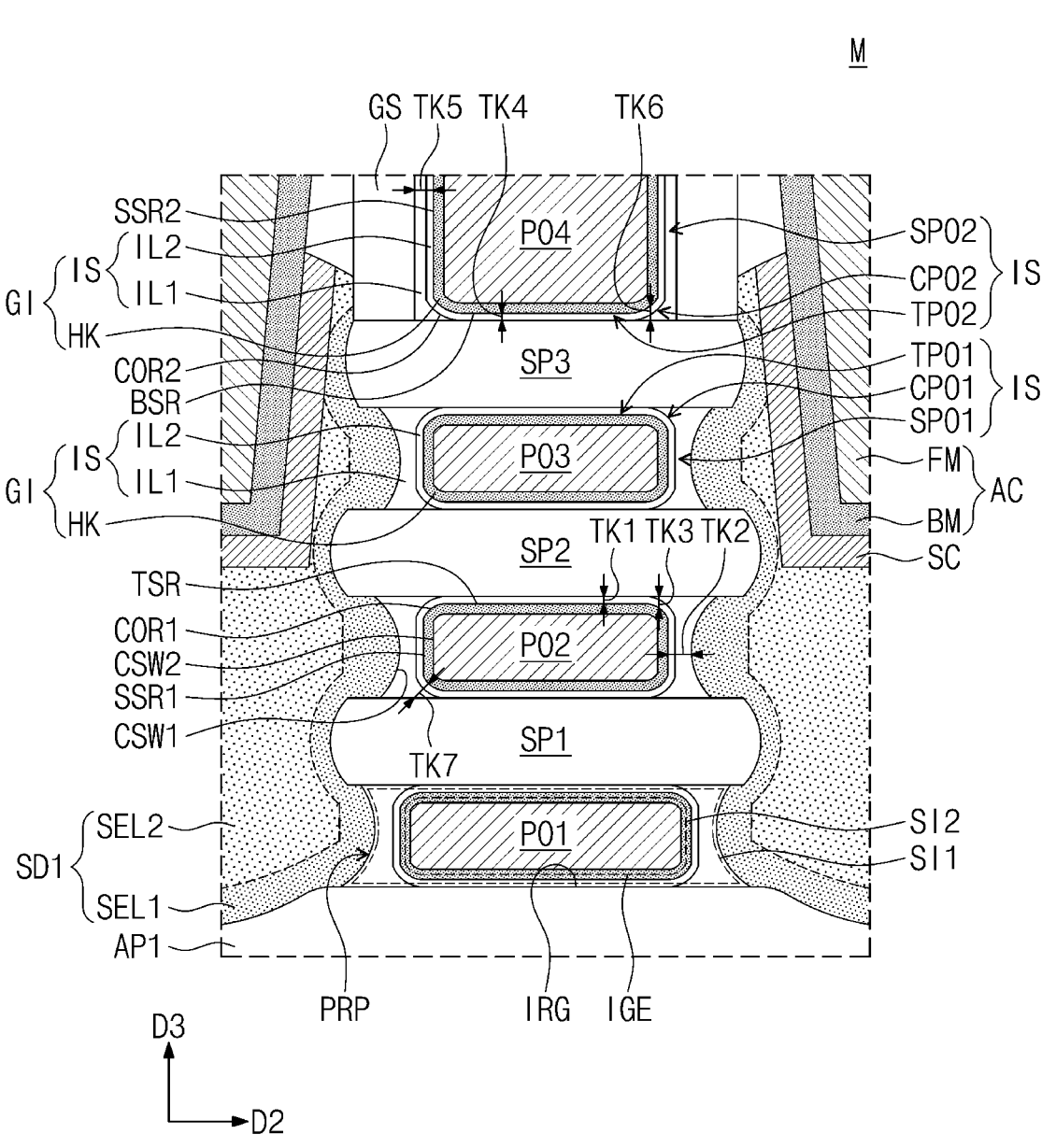
FIG. 6A illustrates an enlarged view showing an example of section M depicted in FIG. 5A.
Figure 6B:
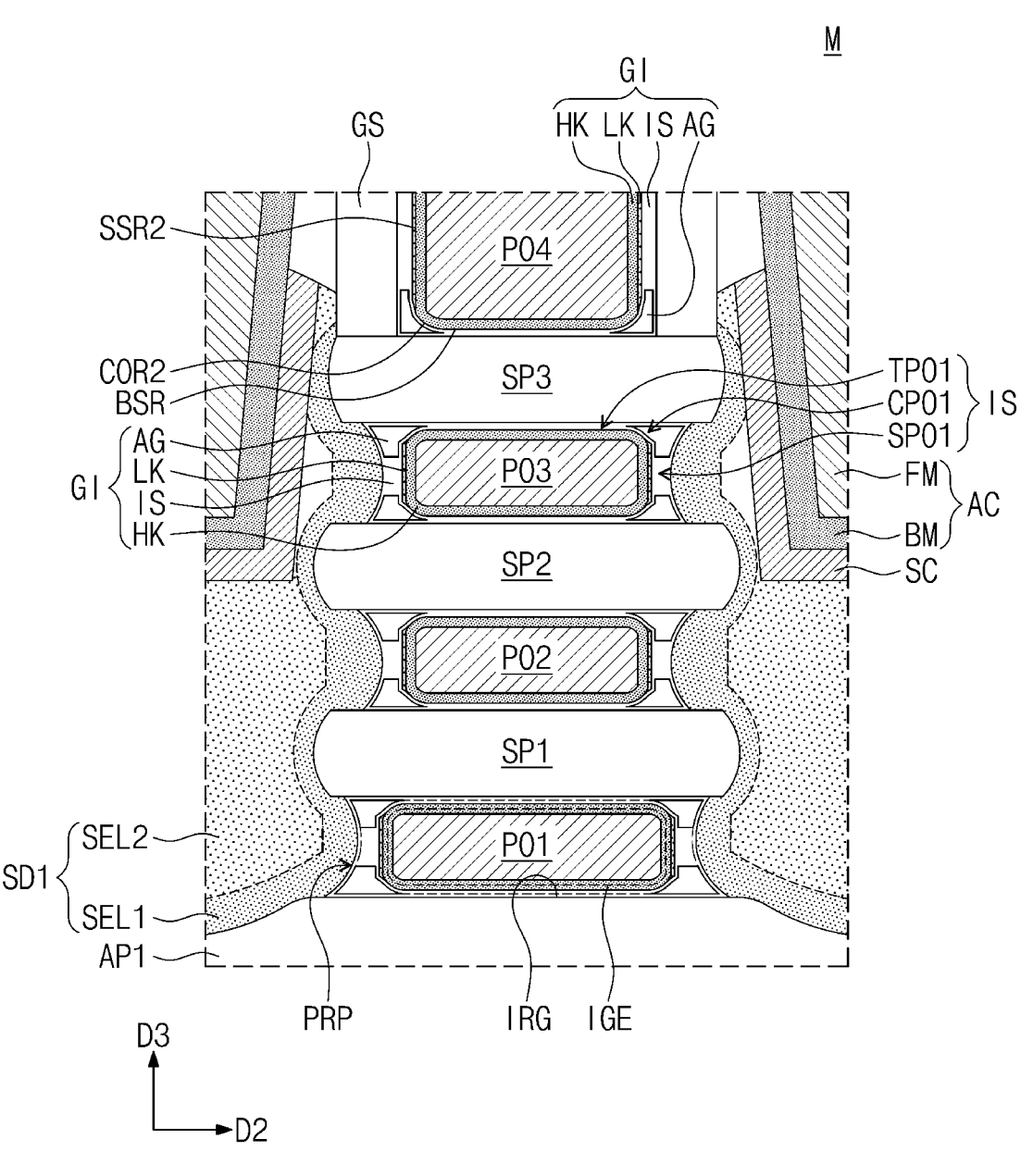
FIG. 6B illustrates an enlarged view showing an example of section M depicted in FIG. 5A.
Figure 6C:
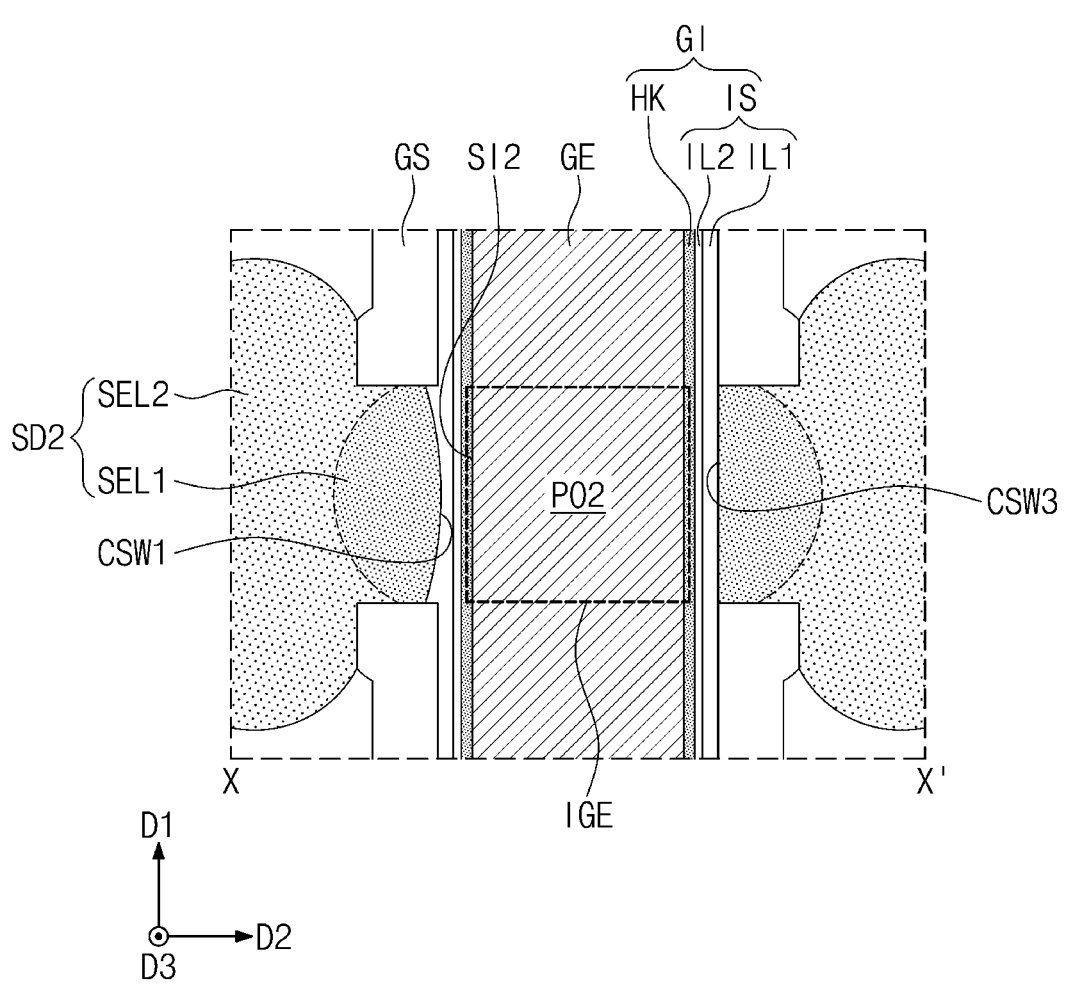
FIG. 6C illustrates a plan view showing an example that corresponds to line X-X' of FIG. 5B.

Referring to FIG. 5D, the gate electrode GE may be provided on a top surface TS, a bottom surface BS, and opposite sidewalls SW of each of the first, second, and third semiconductor patterns SP1, SP2, and SP3. For example, a transistor according to the present embodiment may be a three-dimensional field effect transistor (e.g., MBCFET or GAAFET) in which the gate electrode GE three-dimensionally surrounds the first and second channel patterns CH1 and CH2.

Referring back to FIGS. 4 and 5A to 5D, a pair of gate spacers GS may be disposed on opposite sidewalls of the outer electrode PO4 of the gate electrode GE. The gate spacers GS may extend in the first direction D1 along the gate electrode GE. The gate spacers GS may have their top surfaces higher than that of the gate electrode GE. In some embodiments, the gate spacers GS may include or be formed of at least one selected from SiCN, SiCON, and SiN. In some embodiments, the gate spacers GS may be a multiple layer formed of at least two selected from SiCN, SiCON, and SiN.

A gate capping pattern GP may be provided on each gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include or be formed of at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may directly cover the top surface TS, the bottom surface BS, and the opposite sidewalls SW of each of the first, second, and third semiconductor patterns SP1, SP2, and SP3. The gate dielectric layer GI may cover a top surface of the device isolation layer ST that underlies the gate electrode GE.

In some embodiments of the present inventive concepts, referring to FIG. 6A, the gate dielectric layer GI may include an inner spacer IS and a high-k dielectric layer HK. In some embodiments, the inner spacer IS may include a first dielectric layer IL1 and a second dielectric layer IL2. Each of the first and second dielectric layers IL1 and IL2 may include or be a silicon-containing dielectric material. Each of the first and second dielectric layers IL1 and IL2 may include or be, for example, a silicon oxide layer, a silicon oxynitride layer, or a silicon nitride layer.

The high-k dielectric layer HK may include a high-k dielectric material whose dielectric constant is greater than that of a silicon oxide layer. For example, the high-k dielectric layer HK may include or be formed of at least one selected from hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Referring back to FIGS. 4 and 5A to 5D, the gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may be a work-function metal that controls a threshold voltage of a transistor. A thickness and composition of the first metal pattern may be adjusted to achieve a desired threshold voltage of a transistor. For example, the first, second, and third inner electrodes PO1, PO2, and PO3 of the gate electrode GE may be formed of the first metal pattern or the work-function metal.

The first metal pattern may include or be a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include or be metal whose resistance is less than that of the first metal pattern. For example, the second metal pattern may include or be at least one metal selected from tungsten (W), aluminum (Al), titanium (Ti), and tantalum (Ta). For example, the outer electrode PO4 of the gate electrode GE may include a first metal pattern and a second metal pattern on the first metal pattern.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon with a second interlayer dielectric layer 120 that covers the gate capping pattern GP. A third interlayer dielectric layer 130 may be provided on the second interlayer dielectric layer 120. A fourth interlayer dielectric layer 140 may be provided on the third interlayer dielectric layer 130. For example, the first to fourth interlayer dielectric layers 110 to 140 may include or be a silicon oxide layer.

The single height cell SHC may have a first boundary BD1 and a second boundary BD2 that are opposite to each other in the second direction D2. The first and second boundaries BD1 and BD2 may extend in the first direction D1. The single height cell SHC may have a third boundary BD3 and a fourth boundary BD4 that are opposite to each other in the first direction D1. The third and fourth boundaries BD3 and BD4 may extend in the second direction D2.

The single height cell SHC may be provided on its opposite sides with a pair of separation structures DB that are opposite to each other in the second direction D2. For example, the pair of separation structures DB may be correspondingly provided on first and second boundaries BD1 and BD2 of the single height cell SHC. The separation structure DB may extend in the first direction D1 parallel to the gate electrodes GE. A pitch between the separation structure DB and its adjacent gate electrode GE may be the same as the first pitch.

The separation structure DB may penetrate the first interlayer dielectric layer 110 and a first channel pattern CH1 to extend into the first and second active patterns AP1 and AP2. The separation structure DB may penetrate an upper portion of each of the first and second active patterns AP1 and AP2. The separation structure DB may electrically separate an active region of the single height cell SHC from an active region of an adjacent another cell.

A plurality of active contacts AC may be provided to penetrate the first and second interlayer dielectric layers 110 and 120 to come into electrical connection with the first and second source/drain patterns SD1 and SD2. A pair of active contacts AC may be correspondingly provided on opposite sides of the gate electrode GE. When viewed in plan, each active contact AC may have a bar shape that extends in the first direction D1.

The active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A metal-semiconductor compound layer SC, such as a silicide layer, may be interposed between the active contact AC and the first source/drain pattern SD1 and between the active contact AC and the second source/drain pattern SD2. The active contact AC may be electrically connected through the metal-semiconductor compound layer SC to one of the first and second source/drain patterns SD1 and SD2. For example, the metal-semiconductor compound layer SC may be or may include at least one selected from titanium silicide, tantalum silicide, tungsten silicide, nickel silicide, and cobalt silicide.

A plurality of gate contacts GC may be provided to penetrate the second interlayer dielectric layer 120 and the gate capping pattern GP to come into electrical connection with the gate electrodes GE. When viewed in plan, the gate contacts GC may be disposed to correspondingly overlap the first active region AR1 and the second active region AR2. For example, the gate contact GC may be provided on the second active pattern AP2 (see FIG. 5D).

In some embodiments of the present inventive concepts, referring to FIG. 5B, the active contact AC may have an upper portion adjacent to the gate contact GC, and an upper dielectric pattern UIP may fill the upper portion of the active contact AC. The upper dielectric pattern UIP may have a bottom surface lower than that of the gate contact GC. For example, the upper dielectric pattern UIP may cause the active contact AC adjacent to the gate contact GC to have a top surface lower than the bottom surface of the gate contact GC. Therefore, it may be possible to prevent a short-circuit resulting from contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include or be formed of at least one metal selected from aluminum, copper, tungsten, molybdenum, and cobalt. The barrier pattern BM may cover sidewalls and a bottom surface of the conductive pattern FM. The barrier pattern BM may include or be formed of a metal layer and a metal nitride layer. The metal layer may be or include at least one selected from titanium, tantalum, tungsten, nickel, cobalt, and platinum. The metal nitride layer may be or include at least one selected from a titanium nitride (TiN) layer, a tantalum nitride (TaN) layer, a tungsten nitride (WN) layer, a nickel nitride (NiN) layer, a cobalt nitride (CON) layer, and a platinum nitride (PtN) layer.

A first metal layer M1 may be provided in the third interlayer dielectric layer 130. For example, the first metal layer M1 may include a first power line M1_R1, a second power line M1_R2, and first wiring lines M1_I. The lines M1_R1, M1_R2, and M1_I of the first metal layer M1 may extend in parallel to each other in the second direction D2.

For example, the first and second power lines M1_R1 and M1_R2 may be respectively provided on the third and fourth boundaries BD3 and BD4 of the single height cell SHC. The first power line M1_R1 may extend in the second direction D2 along the third boundary BD3. The second power line M1_R2 may extend in the second direction D2 along the fourth boundary BD4.

The first wiring lines M1_I (also described as interconnection lines) of the first metal layer M1 may be disposed between the first and second power lines M1_R1 and M1_R2. The first wiring lines M1_I of the first metal layer M1 may be arranged at a second pitch along the first direction D1. The second pitch may be less than the first pitch. Each of the first wiring lines M1_I may have a line-width less than that of each of the first and second power lines M1_R1 and M1_R2. The first and second power lines M1_R1 and M1_R2 may be lines configured to connect to a power source circuit and connected to components within the semiconductor device that operate by receiving power (e.g., voltage).

The first metal layer M1 may be connected to first vias VI1. The first vias VI1 may be correspondingly provided below the lines M1_R1, M1_R2, and M1_I of the first metal layer M1. A first via VI1 may electrically connect an active contact AC to one of the lines M1_R1, M1_R2, M1_R3, and M1_I of the first metal layer M1. A first via VI1 may electrically connect a gate contact GC to one of the lines M1_R1, M1_R2, and M1_I of the first metal layer M1.

A certain line and its underlying first via VI1 of the first metal layer M1 may be formed by individual (e.g., different) processes. For example, the certain line and its underlying first via VI1 of the first metal layer M1 may each be formed by a single damascene process. A sub-20 nm process may be employed to fabricate a semiconductor device according to the present embodiment.

A second metal layer M2 may be provided in the fourth interlayer dielectric layer 140. The second metal layer M2 may include a plurality of second wiring lines M2_I. The second wiring lines M2_I of the second metal layer M2 may each have a linear or bar shape that extends in the first direction D1. For example, the second wiring lines M2_I may extend in parallel to each other in the first direction D1.

The second metal layer M2 may be connected to second vias VI2 that are correspondingly provided below the second wiring lines M2_I. A certain line of the first metal layer M1 may be electrically connected through the second via VI2 to a corresponding line of the second metal layer M2. For example, a wiring line and its underlying second via VI2 of the second metal layer M2 may be simultaneously formed in a dual damascene process.

The first and second metal layers M1 and M2 may have their wiring lines that include the same or different conductive materials. For example, the wiring lines of the first and second metal layers M1 and M2 may be or may include at least one metallic material selected from aluminum, copper, tungsten, molybdenum, ruthenium, and cobalt. Although not shown, other metal layers (e.g., M3, M4, M5, etc.) may be additionally stacked on the fourth interlayer dielectric layer 140. Each of the stacked metal layers may include wiring lines for routing between cells.

With reference to FIG. 6A, the following will describe in detail the inner spacer IS on the first channel pattern CH1. Referring to FIG. 6A, the first source/drain pattern SD1 may include protrusions PRP that protrude toward the first, second, and third inner electrodes PO1, PO2, and PO3 of the gate electrode GE. The protrusion PRP of the first source/drain pattern SD1 may have a first sidewall CSW1. The first sidewall CSW1 according to the present embodiment may be convex toward a corresponding one of the first, second, and third inner electrodes PO1, PO2, and PO3.

Each of the first, second, and third inner electrodes PO1, PO2, and PO3 of the gate electrode GE may have a second sidewall CSW2. The second sidewall CSW2 may vertically extend in the third direction D3. The second sidewall CSW2 may have a flat profile parallel to the third direction D3. The second sidewall CSW2 may face the first sidewall CSW1 of the first source/drain pattern SD1.

Each of the first, second, and third inner electrodes PO1, PO2, and PO3 according to the present embodiment may not have a concave sidewall that corresponds to the first sidewall CSW1 of the first source/drain pattern SD1. This may be caused by the fact that the inner spacer IS may provide an inner gate space IGE in which a corresponding one of the inner electrodes PO1, PO2, and PO3 has the second sidewall CSW2.

In some embodiments of the present inventive concepts, the first, second, and third inner electrodes PO1, PO2, and PO3 may have their widths different from each other. For example, a maximum width in the second direction D2 of the first inner electrode PO1 may be greater than a maximum width in the second direction D2 of the second inner electrode PO2. The maximum width in the second direction D2 of the first inner electrode PO1 may be greater than a maximum width in the second direction D2 of the third inner electrode PO3.

The first source/drain pattern SD1 may include a first semiconductor layer SEL1 and a second semiconductor layer SEL2 on the first semiconductor layer SEL1. In some embodiments, when the first source/drain pattern SD1 is n-type, the first semiconductor layer SEL1 may be or include the same semiconductor material, such as silicon (Si), as that of the second semiconductor layer SEL2. However, a concentration of n-type impurities (e.g., phosphorus or arsenic) in the second semiconductor layer SEL2 may be greater than a concentration of n-type impurities in the first semiconductor layer SEL1.

In some embodiments, when the first source/drain pattern SD1 is p-type, the first semiconductor layer SEL1 may have the same semiconductor material, such as silicon-germanium (SiGe), as that of the second semiconductor layer SEL2. However, a germanium concentration of the semiconductor layer SEL2 may be greater than that of the first semiconductor layer SEL1. In addition, a concentration of p-type impurities (e.g., boron) in the second semiconductor layer SEL2 may be greater than a concentration of p-type impurities in the first semiconductor layer SEL1.

The first semiconductor layer SEL1 may contact the first, second, and third semiconductor patterns SP1, SP2, and SP3. The first semiconductor layer SEL1 may include the protrusions PRP. The inner spacer IS may directly cover the first semiconductor layer SEL1. The first, second, and third inner electrodes PO1, PO2, and PO3 of the gate electrode GE may be spaced apart from the first semiconductor layer SEL1 across the inner spacer IS. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

A pair of first source/drain patterns SD1 may be provided with inner regions IRG therebetween. The first, second, and third inner electrodes PO1, PO2, and PO3 of the gate electrode GE may be correspondingly provided in the inner regions IRG. The inner spacer IS and the high-k dielectric layer HK may further be provided in each of the inner regions IRG.

The inner spacer IS may partially fill the inner region IRG. The inner spacer IS may provide the inner gate space IGE. For example, the inner region IRG may have a remaining space not occupied by the inner spacer IS, and the remaining space of the inner region IRG may be defined as the inner gate space IGE. The inner gate space IGE may be provided therein with the high-k dielectric layer HK and one of the inner electrodes PO1, PO2, and PO3.

In some embodiments, a length in the second direction D2 of the inner region IRG may gradually decrease and then increase in the third direction D3. The inner region IRG may have a first side SI1 that is concave to correspond to the first sidewall CSW1. A length in the second direction D2 of the inner gate space IGE may gradually increase and then decrease in the third direction D3. The inner gate space IGE may have a second side SI2 that vertically extends in the third direction D3 to correspond to the second sidewall CSW2. The second side SI2 may have a flat profile parallel to the third direction D3. Unlike the concave profile of the first side SI1 of the inner region IRG, the inner spacer IS may cause the inner gate space IGE to have a second side SI2 having a vertical profile.

The following will representatively describe the second inner electrode PO2 and the gate dielectric layer GI that surrounds the second inner electrode PO2. The gate dielectric layer GI may be interposed between the second inner electrode PO2 and the first semiconductor pattern SP1, between the second inner electrode PO2 and the second semiconductor pattern SP2, and between the second inner electrode PO2 and the first source/drain pattern SD1.

The gate dielectric layer GI may include the inner spacer IS and the high-k dielectric layer HK. The inner spacer IS may include the first dielectric layer IL1 and the second dielectric layer IL2 on the first dielectric layer IL1. The first dielectric layer IL1 may directly cover a portion of a top surface of the first semiconductor pattern SP1, a portion of a bottom surface of the second semiconductor pattern SP2, and the first sidewall CSW1 of the first source/drain pattern SD1. The first dielectric layer IL1 may extend from the portion of the top surface of the first semiconductor pattern SP1 toward the portion of the bottom surface of the second semiconductor pattern SP2, while covering the first sidewall CSW1 of the first source/drain pattern SD1.

The second dielectric layer IL2 may directly cover another portion of the top surface of the first semiconductor pattern SP1, another portion of the bottom surface of the second semiconductor pattern SP2, and an inner lateral surface of the first dielectric layer IL1. The high-k dielectric layer HK may be interposed between the inner spacer IS and the second inner electrode PO2. The high-k dielectric layer HK may directly cover a surface of the second inner electrode PO2 of the gate electrode GE.

Each of the first and second dielectric layers IL1 and IL2 may include or may be formed of a silicon-containing dielectric material. Each of the first and second dielectric layers IL1 and IL2 may include or be formed of a silicon oxide layer, a silicon oxynitride layer, or a silicon nitride layer. In some embodiments of the present inventive concepts, the first and second dielectric layers IL1 and IL2 may all be a silicon oxide layer. When the first and second dielectric layers IL1 and IL2 include the same material (e.g., silicon oxide), no boundary may be present between the first and second dielectric layers IL1 and IL2. For example, the first and second dielectric layers IL1 and IL2 may constitute the inner spacer IS as a single silicon integrated oxide layer.

In some embodiments of the present inventive concepts, the first dielectric layer IL1 may be a silicon nitride layer, and the second dielectric layer IL2 may be a silicon oxide layer. In this case, a boundary may be ascertained between the first and second dielectric layers IL1 and IL2.

A thickness of the inner spacer IS may be a sum of thicknesses of the first and second dielectric layers IL1 and IL2. A first thickness TK1 may be defined to indicate a thickness in a vertical direction, or the third direction D3, of the inner spacer IS. The inner spacer IS may include a first horizontal part TPO1 on a top surface TSR or a bottom surface of the high-k dielectric layer HK. The first horizontal part TPO1 may have the first thickness TK1. The first thickness TK1 may be less than a thickness of the high-k dielectric layer HK.

A second thickness TK2 may be defined to indicate a thickness in a horizontal direction, or the second direction D2, of the inner spacer IS. The inner spacer IS may include a first vertical part SPO1 on a first lateral surface SSR1 of the high-k dielectric layer HK. The first lateral surface SSR1 may vertically extend in the third direction D3. The first vertical part SPO1 may have the second thickness TK2. The second thickness TK2 may be greater than a thickness of the high-k dielectric layer HK.

A thickness at a corner of the inner spacer IS may be a third thickness TK3. The high-k dielectric layer HK may include a first corner COR1 that is curved between the top surface TSR thereof and the first lateral surface SSR1 thereof. The first corner COR1 may connect the top surface TSR to the first lateral surface SSR1. The inner spacer IS may include a first corner part CPO1 on the first corner COR1 of the high-k dielectric layer HK. The first corner part CPO1 may be positioned between the first horizontal part TPO1 and the first vertical part SPO1. The first corner part CPO1 may have a third thickness TK3 in the third direction D3 (e.g., between a top or outer surface and a bottom or inner surface of the inner spacer IS in the third direction D3 at the corner). The third thickness TK3 may be greater than the first thickness TK1 and less than the second thickness TK2. The corner part CPO1 may also have a thickness TK7 in a direction perpendicular to an inner surface of the inner spacer IS, which thickness may be greater than the first thickness TK1 and may also be greater than the third thickness TK3. At some locations along the corner part CPO1 a thickness TK7 may be two or more times the first thickness TK1 (e.g., between two and five times the first thickness TK1).

According to some embodiments of the present inventive concepts, the third thickness TK3 of the first corner part CPO1 may have a value very close to that of the first thickness TK1 of the first horizontal part TPO1. For example, a ratio TK3/TK1 of the third thickness TK3 to the first thickness TK1 may be about 1:1 to 2:1, or for example, about 1.1:1 to about 1.5:1. As the third thickness TK3 of the first corner part CPO1 is very close to the first thickness TK1, the second side SI2 of the inner gate space IGE may have an increased vertical profile.

According to some embodiments of the present inventive concepts, the second thickness TK2 of the first vertical part SPO1 may have a value greater than that of the first thickness TK1 of the first horizontal part TPO1. For example, a ratio TK2/TK1 of the second thickness TK2 to the first thickness TK1 may be about 2:1 to 10:1, for example, about 2.5:1 to about 5:1.

According to the present embodiment, the high-k dielectric layer HK may have a uniform thickness. However, the inner spacer IS may have a configuration in which the second thickness TK2 of the first vertical part SPO1 is greater than the first thickness TK1 of the first horizontal part TPO1. According to the present inventive concepts, the second thickness TK2 of the first vertical part SPO1 may be greater than the first thickness TK1 of the first horizontal part TPO1, and accordingly, the inner spacer IS may provide the inner gate space IGE whose shape is different from that of the inner region IRG.

The following will describe the outer electrode PO4 of the gate electrode GE and the gate dielectric layer GI that surrounds the outer electrode PO4. The gate dielectric layer GI may be interposed between the outer electrode PO4 and the third semiconductor pattern SP3 and between the outer electrode PO4 and the gate spacer GS. The gate dielectric layer GI may include the inner spacer IS and the high-k dielectric layer HK.

A fourth thickness TK4 may be defined to indicate a thickness in a vertical direction, or the third direction D3, of the inner spacer IS. The fourth thickness TK4 may be given to the inner spacer IS on a bottom surface BSR of the high-k dielectric layer HK. The fourth thickness TK4 may be substantially the same as the first thickness TK1.

A fifth thickness TK5 may be defined to indicate a thickness in a horizontal direction, or the second direction D2, of the inner spacer IS. The fifth thickness TK5 may be given to the inner spacer IS on a second lateral surface SSR2 of the high-k dielectric layer HK. The second lateral surface SSR2 may vertically extend along the third direction D3. The fifth thickness TK5 may be the same as or less than the second thickness TK2.

A thickness at a corner of the inner spacer IS may be a sixth thickness TK6. The high-k dielectric layer HK may include a second corner COR2 that is curved between the bottom surface BSR thereof and the second lateral surface SSR2 thereof. The second corner COR2 may refer to a point along the curve that is equidistant from the flat bottom surface BSR and the flat second lateral surface SSR2. The sixth thickness TK6, in the third direction D3, may be given to the inner spacer IS on the second corner COR2 of the high-k dielectric layer HK. The sixth thickness TK6 may be the same as or less than the third thickness TK3.

The inner spacer IS depicted in FIG. 6a may be used not only in NMOSFETs of cells of a semiconductor device, but also in PMOSFETs of cells of the semiconductor device. In some embodiments of the present inventive concepts, the inner spacer IS of FIG. 6A may be used only in NMOSFETs of cells of a semiconductor device, but not in PMOSFETs of cells of the semiconductor device. In some embodiments of the present inventive concepts, the inner spacer IS may be used only in PMOSFETs of cells of a semiconductor device, but not in NMOSFETs of cells of the semiconductor device.

In some embodiments of the present inventive concepts, the inner spacer IS may be used in both PMOSFETs and NMOSFETs of cells of a semiconductor device.

According to some embodiments of the present inventive concepts, the second thickness TK2 of the first vertical part SPO1 of the inner spacer IS may be much greater than the first thickness TK1 of the first horizontal part TPO1 of the inner spacer IS, which may result in an effective reduction in leakage current of a transistor. In the present inventive concepts, a thickness of the inner spacer IS may be selectively increased to improve electrical properties of a semiconductor device.

FIG. 6B illustrates an enlarged view showing an example of section M depicted in FIG. 5A. In the embodiment that follows, a detailed description of technical features repetitive to those discussed above with reference to FIGS. 1 to 6 will be omitted, and a difference thereof will be explained in detail.

Referring to FIG. 6B, the gate dielectric layer GI may include the inner spacer IS and the high-k dielectric layer HK, and may further include a low-k dielectric layer LK and an air gap AG. The low-k dielectric layer LK may be interposed between the inner spacer IS and the first lateral surface SSR1 of the high-k dielectric layer HK. The low-k dielectric layer LK may selectively cover only the first lateral surface SSR1 of the high-k dielectric layer HK, without covering the top surface TSR of the high-k dielectric layer HK.

The air gap AG may be defined as being surrounded by the inner spacer IS. The air gap AG may be provided at the first corner COR1 of the high-k dielectric layer HK. For example, the air gap AG may be defined on the first corner part CPO1 of the inner spacer IS. The air gap AG combined with the inner spacer IS may have a thickness in a vertical direction D3 at the corner part CPO1 similar to the third thickness TK3 described above—for example, greater than the first thickness TK1 and less than the second thickness TK2. In some embodiments, four air gaps AG may be provided in one inner region IRG. The four air gaps AG may be correspondingly adjacent to four corners of the inner gate space IGE.

According to the present embodiment, as the air gap AG is provided on the corner portion of the inner spacer IS, there may be a reduction in capacitance between the first source/drain pattern SD1 and each of the first, second, and third inner electrodes PO1, PO2, and PO3. As a result, a semiconductor device according to the present inventive concepts may increase in electrical properties.

The low-k dielectric layer LK and the air gap AG may also be provided in the gate dielectric layer GI on the outer electrode PO4. The low-k dielectric layer LK may directly cover the second lateral surface SSR2 of the high-k dielectric layer HK. The air gap AG may be provided on the second corner COR2 of the high-k dielectric layer HK. The air gap AG may be interposed between a corner of the outer electrode PO4 and an uppermost semiconductor pattern (or the third semiconductor pattern SP3). It should be appreciated that an "air gap" may comprise a gap having air or other gases (e.g., such as those present during manufacturing) or may comprise a gap forming a vacuum therein.

FIG. 6C illustrates a plan view showing an example that corresponds to line X-X' of FIG. 5B. For example, FIG. 6C shows a plan view of a semiconductor device obtained when the semiconductor device is planarized until a level (e.g., line X-X') of the second inner electrode PO2. Referring to FIG. 6C, the second source/drain pattern SD2 may include a first semiconductor layer SEL1 and a second semiconductor layer SEL2 on the first semiconductor layer SEL1.

The second inner electrode PO2 may be interposed between a pair of second source/drain patterns SD2. The first semiconductor layer SEL1 of the second source/drain pattern SD2 may be adjacent to the second inner electrode PO2. The gate dielectric layer GI may be interposed between the first semiconductor layer SEL1 and the second inner electrode PO2. The gate dielectric layer GI may include the inner spacer IS and the high-k dielectric layer HK. A first sidewall CSW1 may be given to the first semiconductor layer SEL1 of one of a pair of second source/drain patterns SD2, and a third sidewall CSW3 may be given to the first semiconductor layer SEL1 of the other of a pair of second source/drain patterns SD2. The first sidewall CSW1 and the third sidewall CSW3 may have their profiles different from each other. For example, the first sidewall CSW1 may have a convex profile that protrudes toward the second inner electrode PO2. The third sidewall CSW3 may have a flat profile parallel to the first direction D1. In some embodiments of the present inventive concepts, the third sidewall CSW3 may also have a convex profile. However, the third sidewall CSW3 may have a curvature different from that of the first sidewall CSW1.

The first dielectric layer IL1 of the inner spacer IS may directly cover the first sidewall CSW1 and the third sidewall CSW3. The inner spacer IS may define the inner gate space IGE between a pair of second source/drain patterns SD2. The second side SI2 of the inner gate space IGE may have a flat profile parallel to the first direction D1. The second side SI2 adjacent to the convex first sidewall CSW1 may also have a flat profile parallel to the first direction D1.

Even though a pair of second source/drain patterns SD2 have their sidewalls CSW1 and CSW2 different from each other, the inner spacer IS of the present inventive concepts may be configured such that the second side SI2 of the inner gate space IGE may have a uniform profile.

FIGS. 7A to 12C illustrate cross-sectional views showing a method of fabricating a semiconductor device according to some embodiments of the present inventive concepts. In detail, FIGS. 7A, 8A, 9A, 10A, 11A, and 12A illustrate cross-sectional views taken along line A-A' of FIG. 4. FIGS. 9B, 10B, 11B, and 12B illustrate cross-sectional views taken along line C-C' of FIG. 4. FIGS. 7B, 8B, 9C, 10C, 11C, and 12C illustrate cross-sectional views taken along line D-D' of FIG. 4.

Figure 7A:
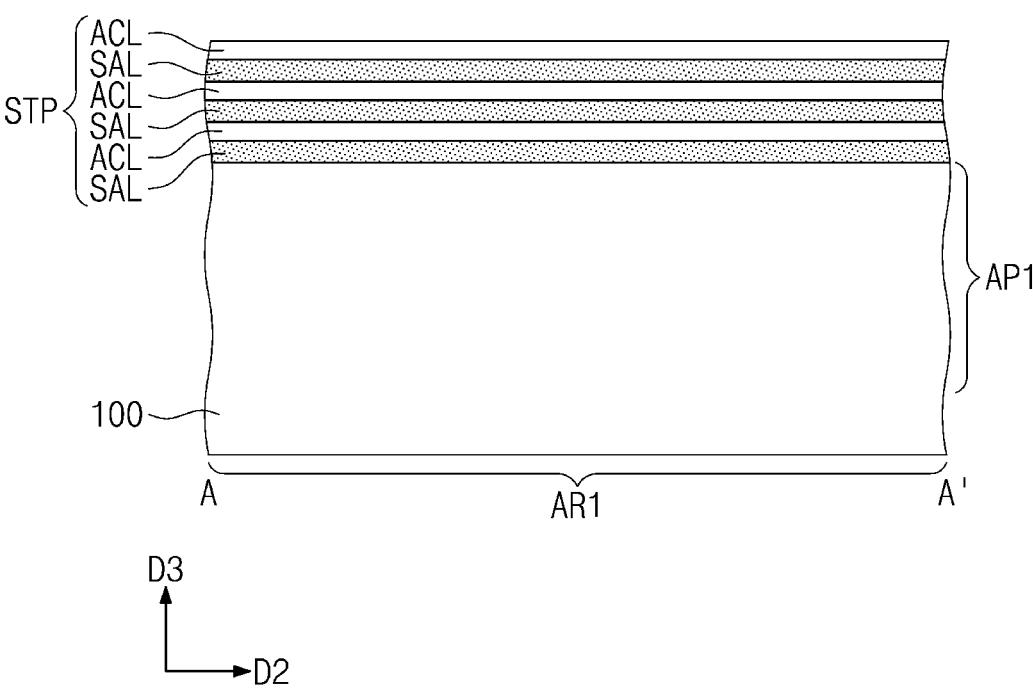
Figure 7B:
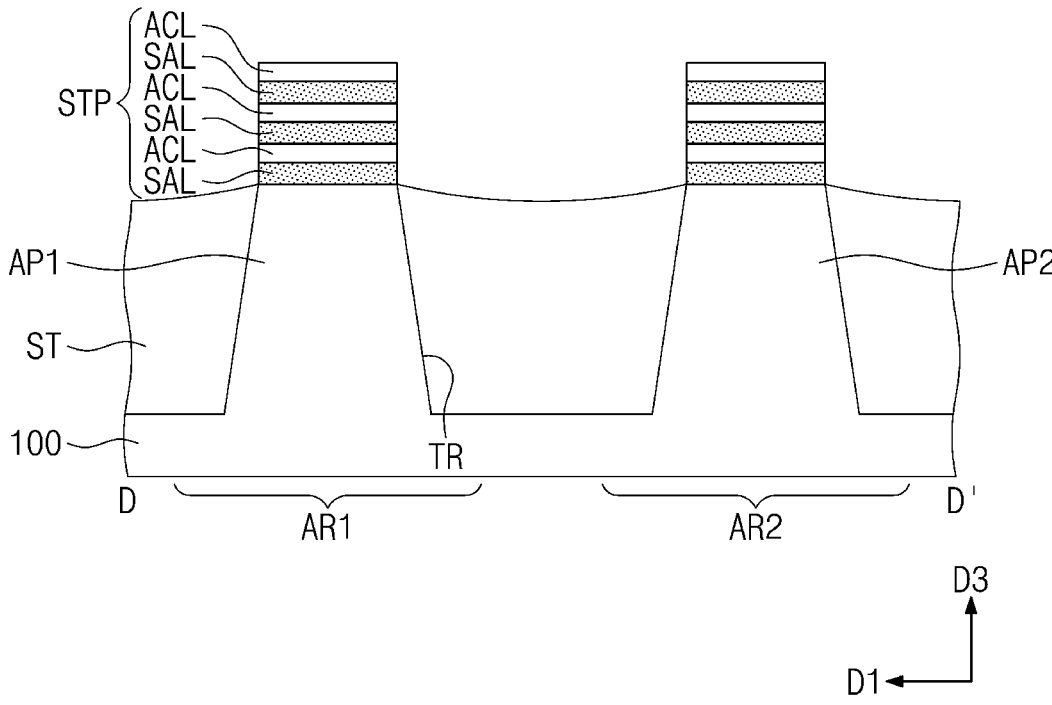

Referring to FIGS. 7A and 7B, a substrate 100 may be provided which includes a first active region AR1 and a second active region AR2. Active layers ACL and sacrificial layers SAL may be alternately stacked on the substrate 100. The active layers ACL may include or be one of silicon (Si), germanium (Ge), and silicon-germanium (SiGe), and the sacrificial layers SAL may include or be another of silicon (Si), germanium (Ge), and silicon-germanium (SiGe).

The sacrificial layer SAL may include a material having an etch selectivity with respect to the active layer ACL. For example, the active layers ACL may be silicon (Si), and the sacrificial layers SAL may be silicon-germanium (SiGe). Each of the sacrificial layers SAL may have a germanium concentration of about 10 at % to about 30 at %.

Mask patterns may be formed on each of the first and second active regions AR1 and AR2 of the substrate 100. The mask pattern may have a linear or bar shape that extends in a second direction D2.

A patterning process may be performed in which the mask patterns are used as an etching mask to form a trench TR that defines a first active pattern AP1 and a second active pattern AP2. The first active pattern AP1 may be formed on the first active region AR1. The second active pattern AP2 may be formed on the second active region AR2.

A stack pattern STP may be formed on each of the first and second active patterns AP1 and AP2. The stack pattern STP may include the active layers ACL and the sacrificial layers SAL that are alternately stacked. During the patterning process, the stack pattern STP may be formed together with the first and second active patterns AP1 and AP2.

A device isolation layer ST may be formed to fill the trench TR. For example, a dielectric layer may be formed on an entire surface of the substrate 100 to cover the stack patterns STP and the first and second active patterns AP1 and AP2. The dielectric layer may be recessed until the stack patterns STP are exposed, and thus the device isolation layer ST may be formed.

The device isolation layer ST may include or be formed of a dielectric material, such as a silicon oxide layer. The stack patterns STP may be exposed upwardly from the device isolation layer ST. For example, the stack patterns STP may vertically protrude upwardly from the device isolation layer ST.

Figure 8A:
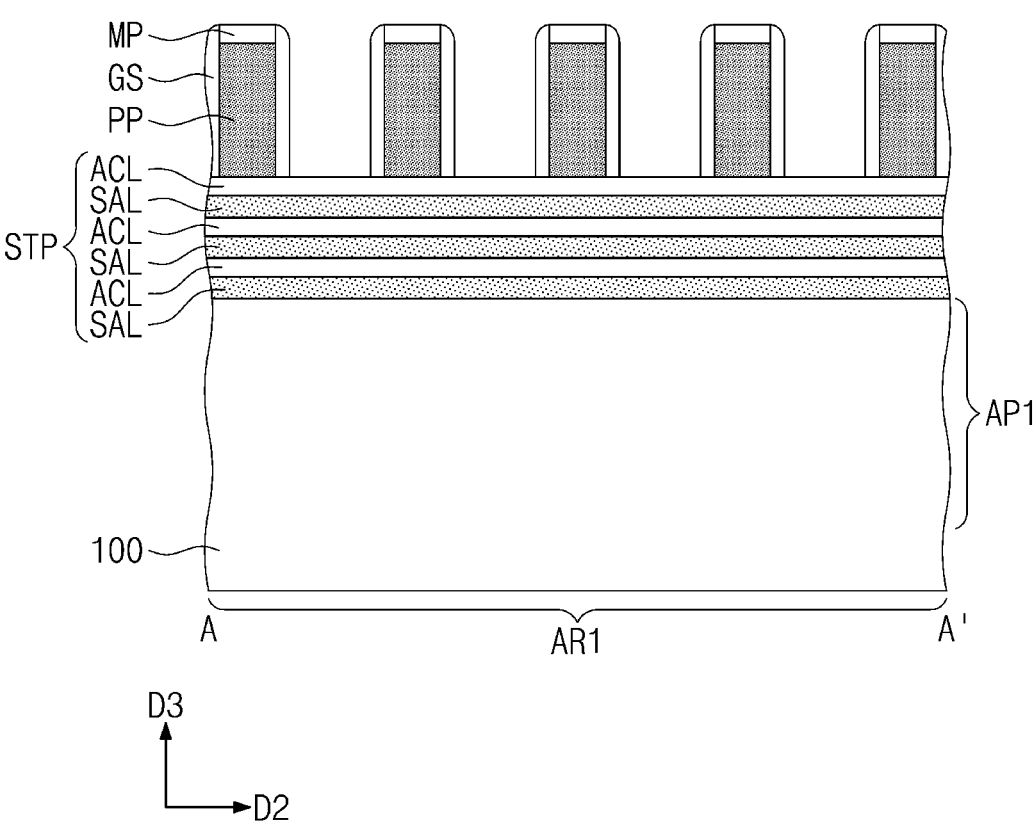
Figure 8B:
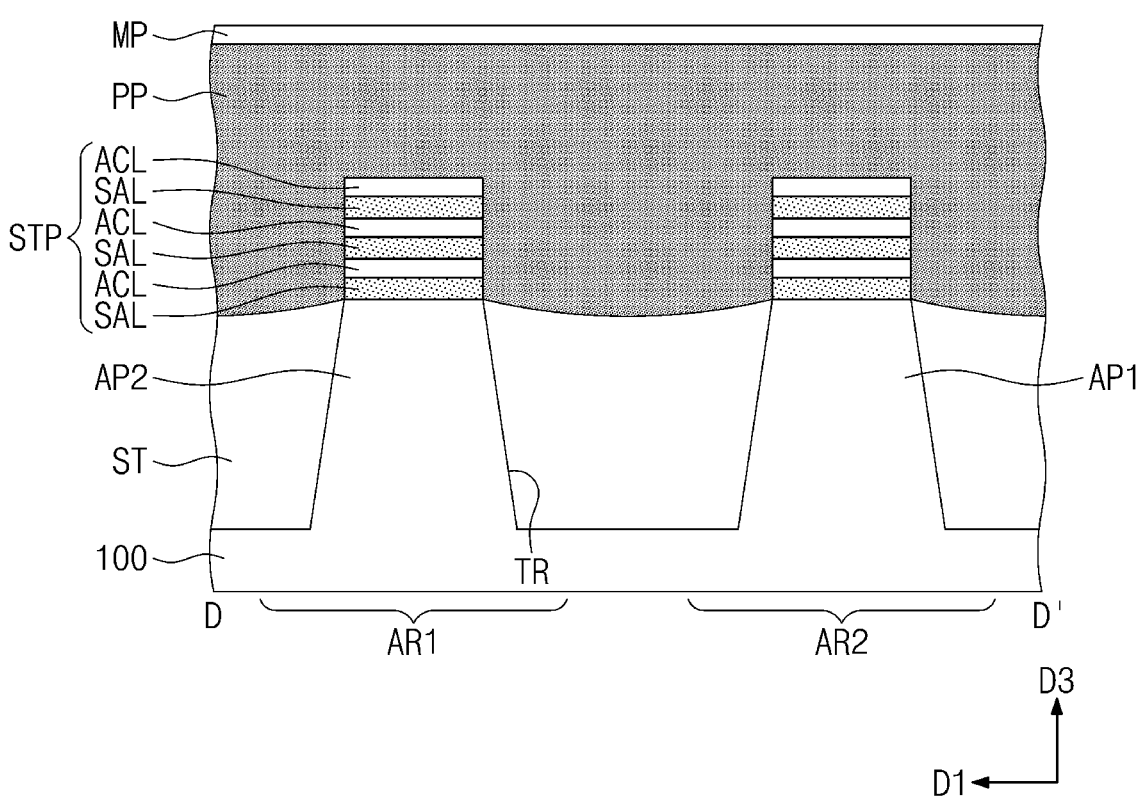

Referring to FIGS. 8A and 8B, sacrificial patterns PP may be formed on the substrate 100, running across the stack patterns STP. Each of the sacrificial patterns PP may be formed to have a linear or bar shape that extends in a first direction D1. The sacrificial patterns PP may be arranged at a first pitch along the second direction D2.

For example, the formation of the sacrificial patterns PP may include forming a sacrificial layer on the entire surface of the substrate 100, forming hardmask patterns MP on the sacrificial layer, and using the hardmask patterns MP as an etching mask to pattern the sacrificial layer. The sacrificial layer may include or be polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. In some embodiments of the present inventive concepts, the gate spacer GS may be a multiple layer including at least two layers.

Figure 9A:
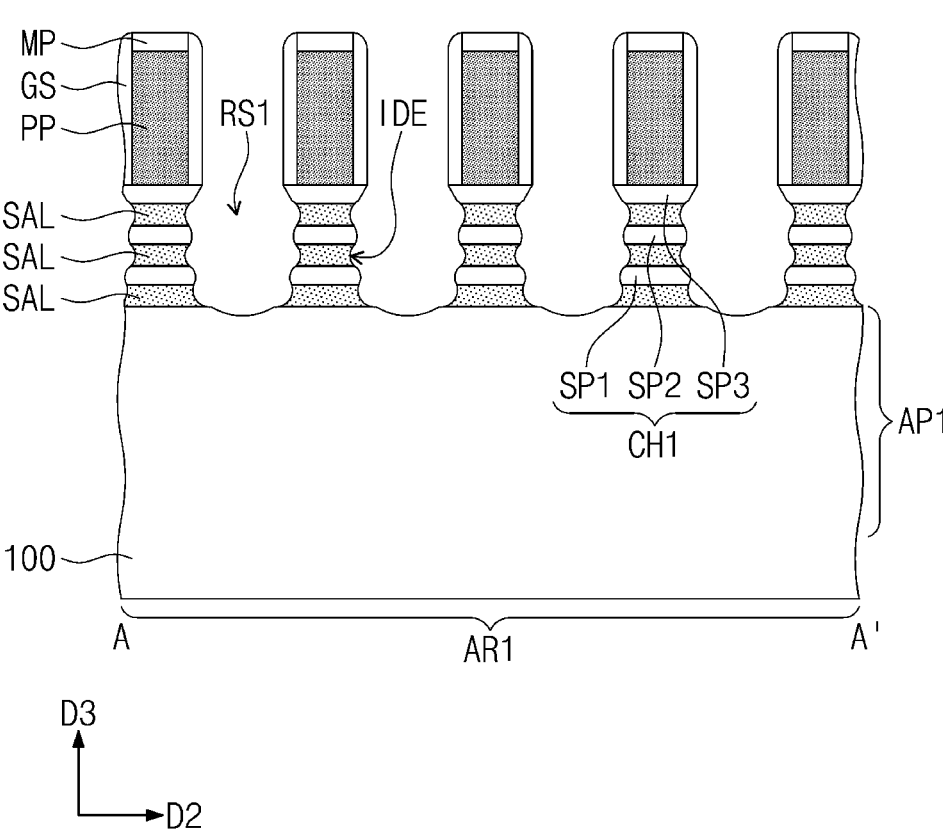
Figure 9B:
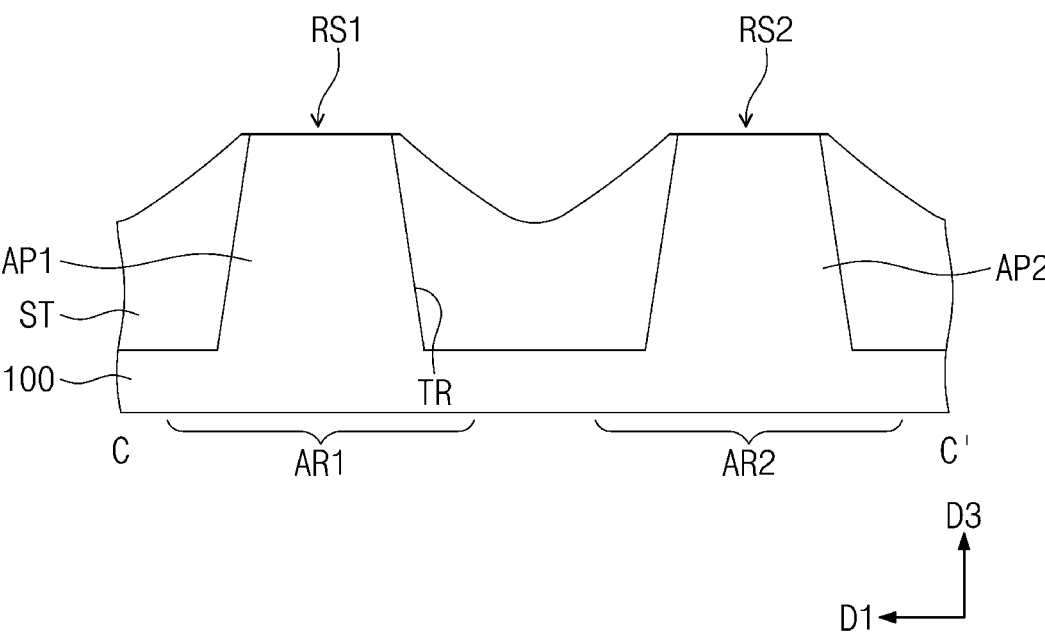
Figure 9C:
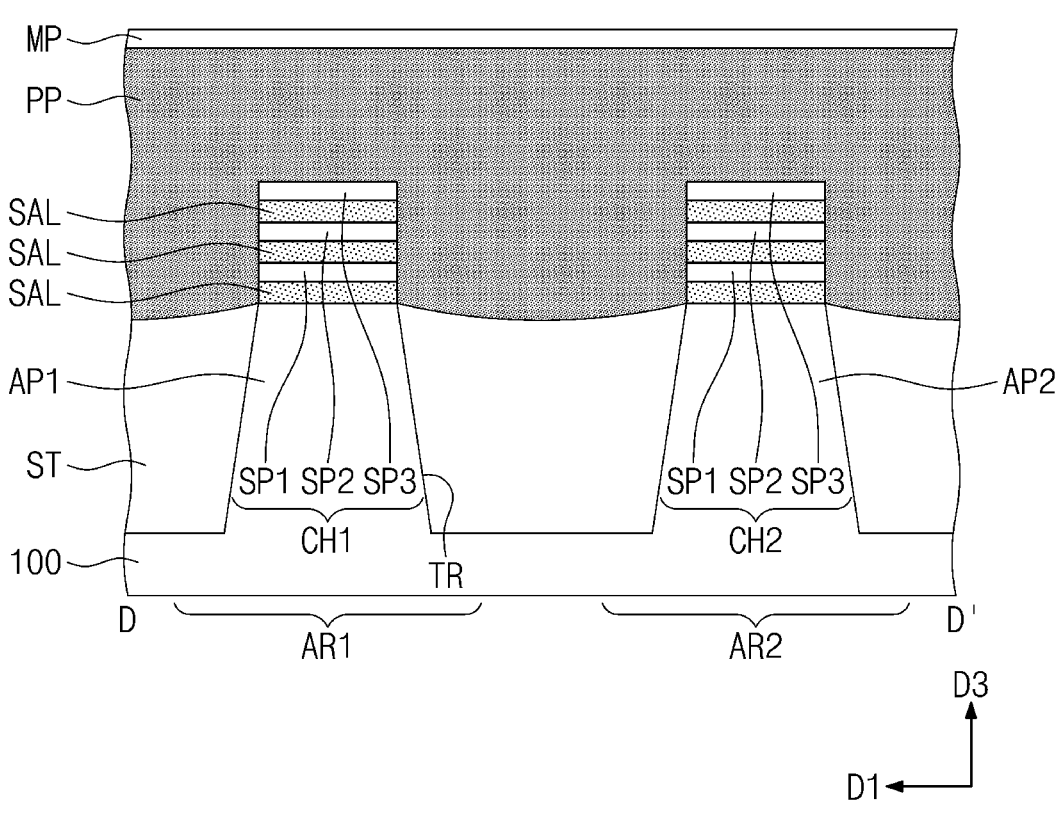

Referring to FIGS. 9A to 9C, first recesses RS1 may be formed in the stack pattern STP on the first active pattern AP1. A plurality of second recesses RS2 may be formed in the stack pattern STP on the second active pattern AP2. During the formation of the first and second recesses RS1 and RS2, the device isolation layer ST may further be recessed on opposite sides of each of the first and second active patterns AP1 and AP2 (see FIG. 9B).

For example, the hardmask patterns MP and the gate spacers GS may be used as an etching mask to etch the stack pattern STP on the first active pattern AP1 to form the first recesses RS1. The first recess RS1 may be formed between a pair of sacrificial patterns PP.

In some embodiments of the present inventive concepts, the formation of the first recess RS1 may include additionally performing a selective etching process on the exposed sacrificial layers SAL. In the selective etching process, each of the sacrificial layers SAL may be indented to form an indent region IDE. Therefore, the first recess RS1 may have a wave-shaped inner lateral surface. The second recesses RS2 in the stack pattern STP on the second active pattern AP2 may be formed by the same method used for the formation of the first recesses RS1.

The active layers ACL may be formed into first, second, and third semiconductor patterns SP1, SP2, and SP3 that are sequentially stacked between neighboring first recesses RS1. A first channel pattern CH1 may be constituted by the first, second, and third semiconductor patterns SP1, SP2, and SP3 between neighboring first recesses RS1. A second channel pattern CH2 may be constituted by the first, second, and third semiconductor patterns SP1, SP2, and SP3 between neighboring second recesses RS2.

Figure 10A:
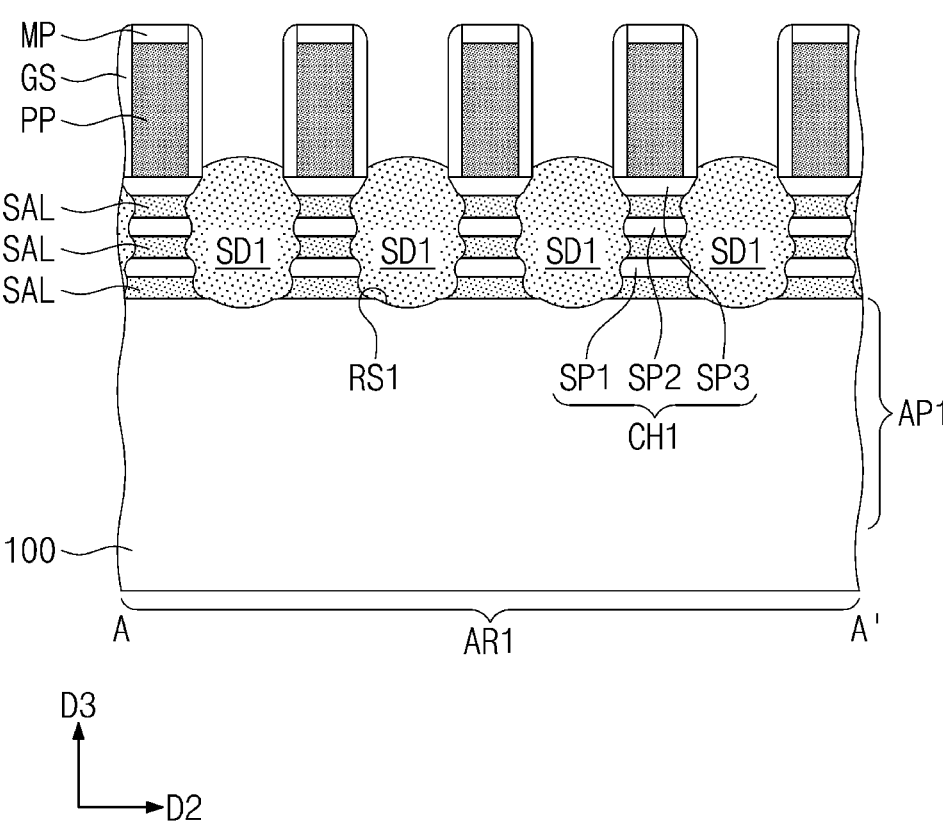
Figure 10B:
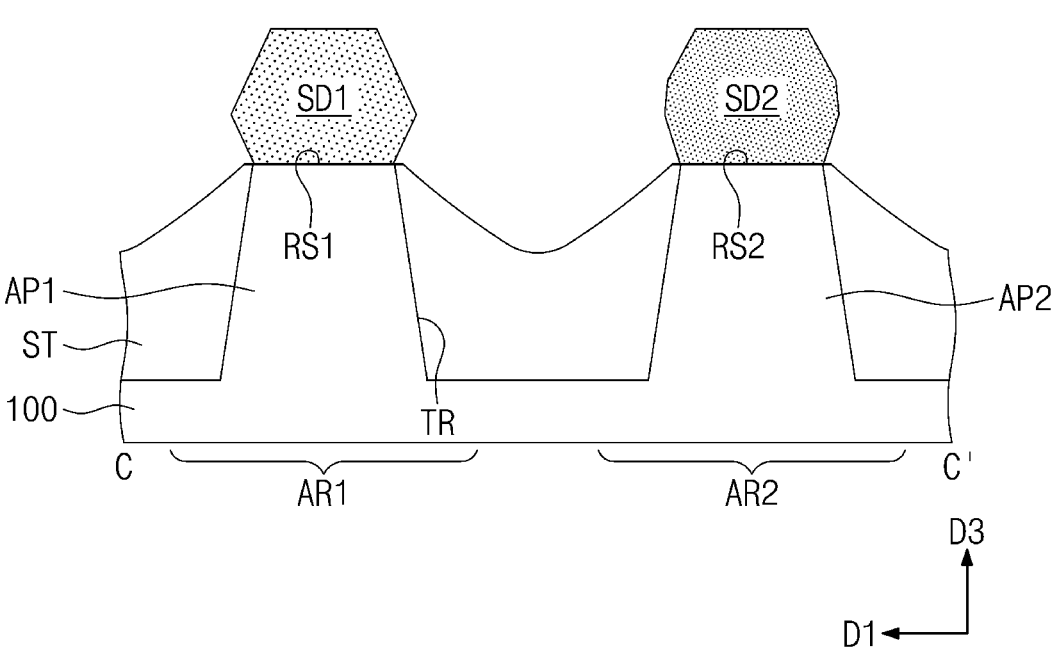
Figure 10C:
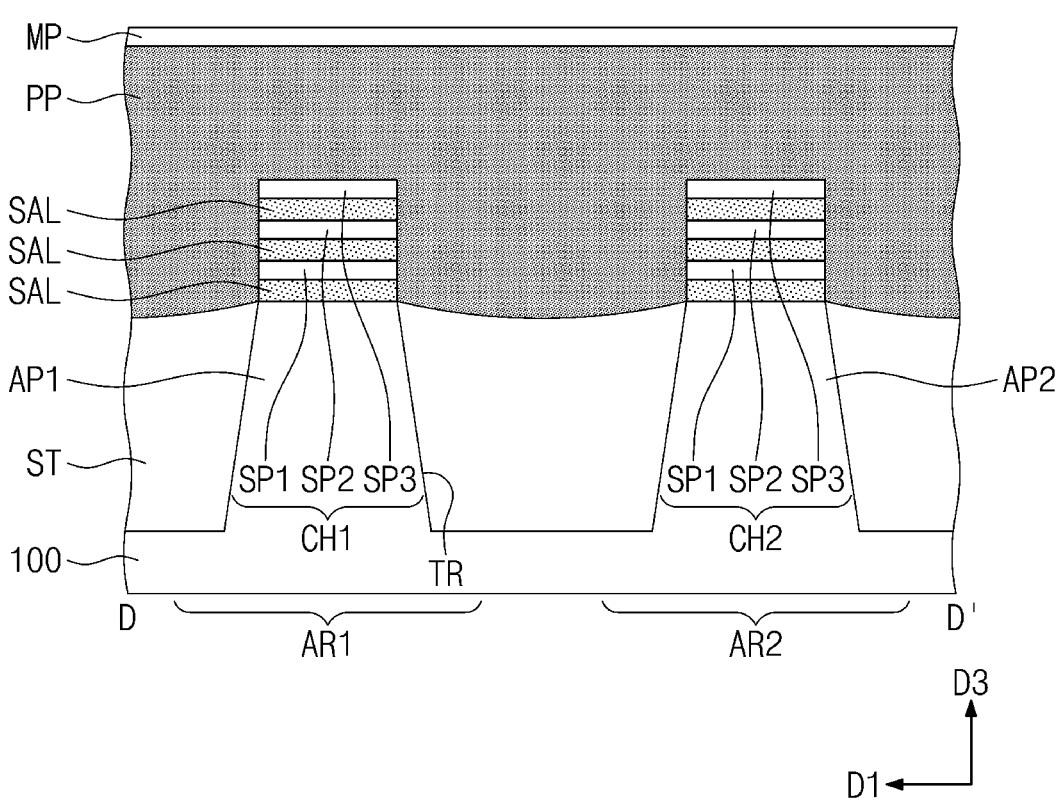

Referring to FIGS. 10A to 10C, first source/drain patterns SD1 may be correspondingly formed in the first recesses RS1. For example, a selective epitaxial growth (SEG) process may be performed in which an inner sidewall of the first recess RS1 is used as a seed layer to form an epitaxial layer that fills the first recess RS1. The epitaxial layer may be grown from a seed or the substrate 100 and the first, second, and third semiconductor patterns SP1, SP1, and SP3 exposed by the first recess RS1. For example, the SEG process may include chemical vapor deposition (CVD) or molecular beam epitaxy (MBE).

In some embodiments of the present inventive concepts, the first source/drain pattern SD1 may include or be formed of the same semiconductor element (e.g., Si) as that of the substrate 100. While the first source/drain pattern SD1 is formed, impurities (e.g., phosphorus, arsenic, or antimony) may be in-situ implanted to allow the first source/drain pattern SD1 to have an n-type conductivity. Alternatively, after the formation of the first source/drain pattern SD1, impurities may be implanted into the first source/drain pattern SD1.

Second source/drain patterns SD2 may be correspondingly formed in the second recesses RS2. For example, a selective epitaxial growth (SEG) process may be performed such that an inner sidewall of the second recess RS2 is used as a seed to form the second source/drain pattern SD2.

In some embodiments of the present inventive concepts, the second source/drain pattern SD2 may include or be formed of a semiconductor element (e.g., SiGe) whose lattice constant is greater than that of a semiconductor element of the substrate 100. While the second source/drain pattern SD2 is formed, impurities (e.g., boron, gallium, or indium) may be in-situ implanted to allow the second source/drain pattern SD2 to have a p-type conductivity. Alternatively, after the formation of the second source/drain pattern SD2, impurities may be implanted into the second source/drain pattern SD2.

Figure 11A:
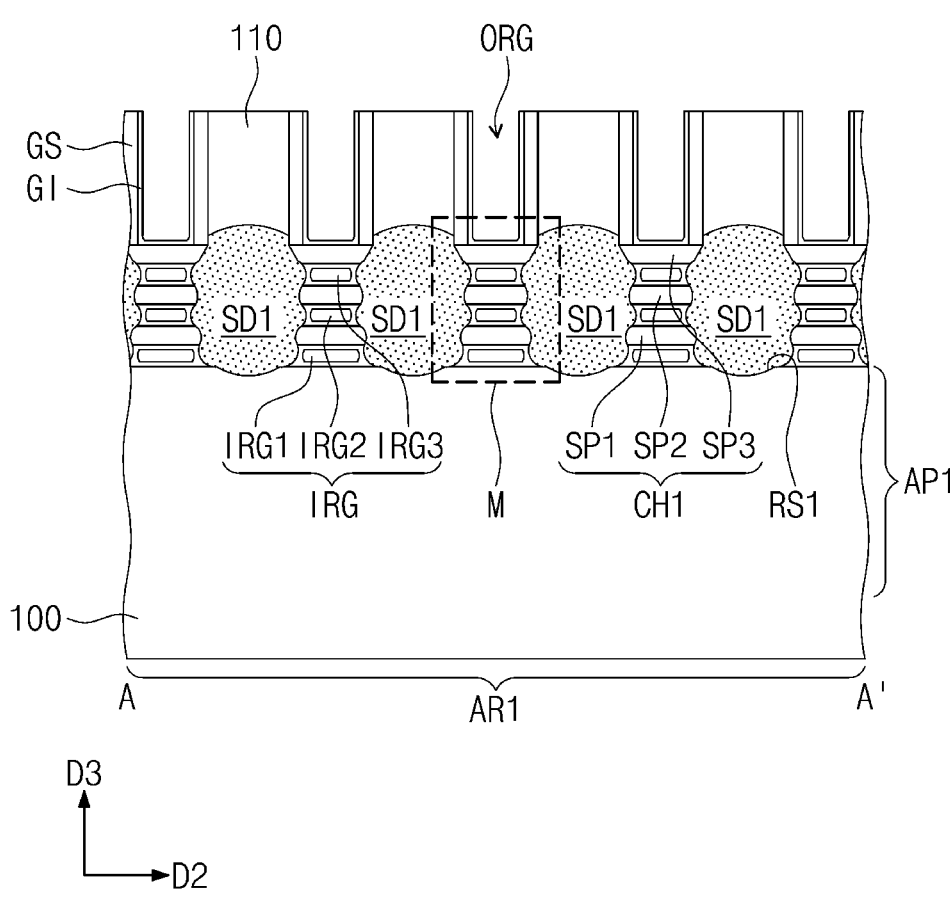
Figure 11B:
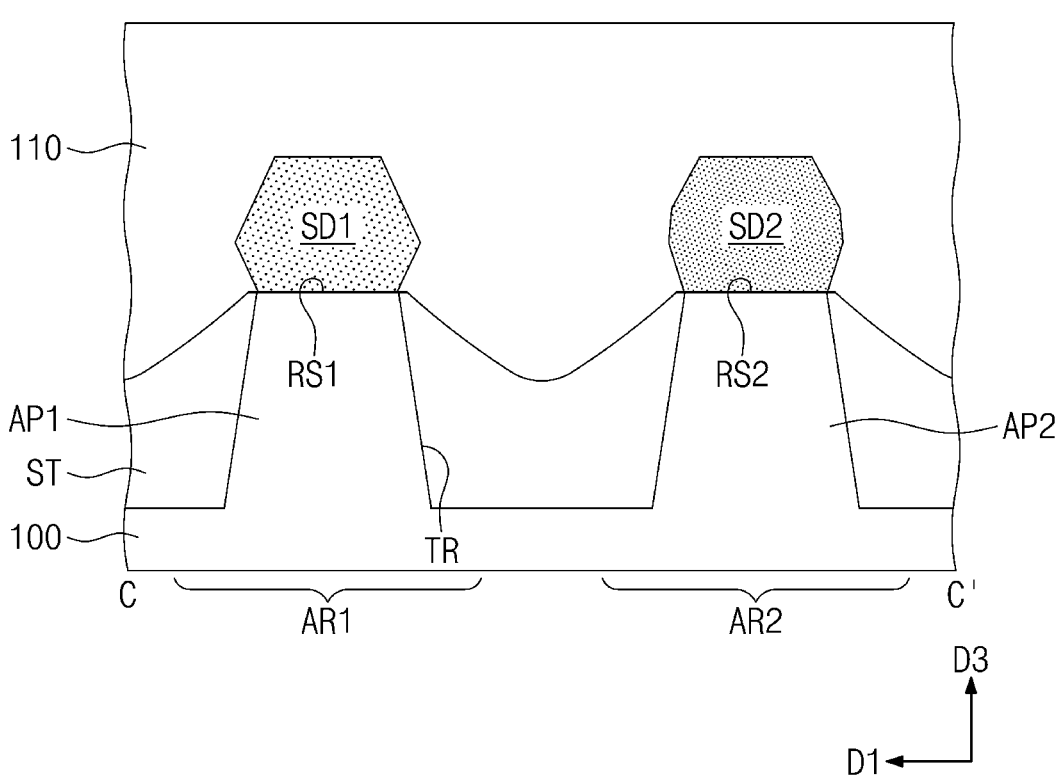
Figure 11C:
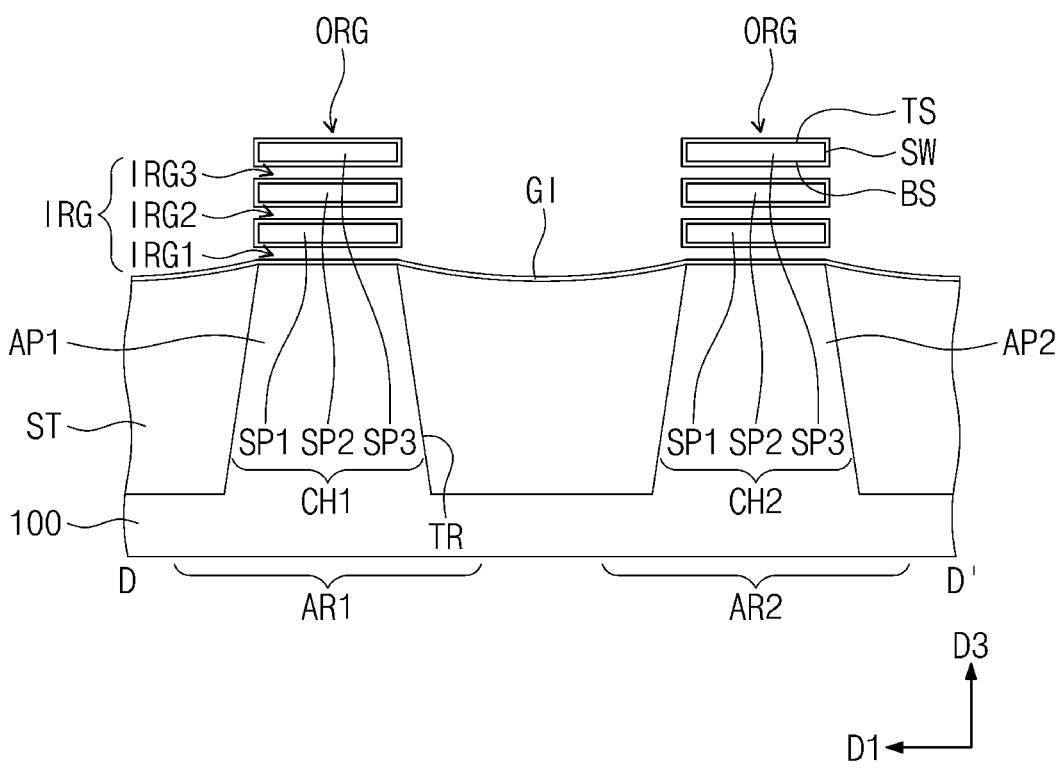

Referring to FIGS. 11A to 11C, a first interlayer dielectric layer 110 may be formed to cover the first and second source/drain patterns SD1 and SD2, the hardmask patterns MP, and the gate spacers GS. For example, the first interlayer dielectric layer 110 may include or be a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MP may all be removed during the planarization process. As a result, the first interlayer dielectric layer 110 may have a top surface coplanar with those of the sacrificial patterns PP and those of the gate spacers GS.

The exposed sacrificial patterns PP may be selectively removed. The removal of the sacrificial patterns PP may form an outer region ORG that exposes the first and second channel patterns CH1 and CH2 (see FIG. 11C). The removal of the sacrificial patterns PP may include performing a wet etching process using an etchant that selectively etches polysilicon.

The sacrificial layers SAL exposed through the outer region ORG may be selectively removed to form inner regions IRG (see FIG. 11C). For example, an etching process that selectively etches the sacrificial layers SAL may be performed such that only the sacrificial layers SAL may be removed while leaving the first, second, and third semiconductor patterns SP1, SP2, and SP3. The etching process may have a high etch rate with respect to silicon-germanium having a relatively high germanium concentration. For example, the etching process may have a high etch rate with respect to silicon-germanium whose germanium concentration is greater than about 10 at %.

The etching process may remove the sacrificial layers SAL on the first and second active regions AR1 and AR2. The etching process may be a wet etching process. An etching material used for the etching process may promptly etch the sacrificial layer SAL whose germanium concentrate is relatively high.

Referring back to FIG. 11C, as the sacrificial layers SAL are selectively removed, only the first, second, and third semiconductor patterns SP1, SP2, and SP3 may remain on each of the first and second active patterns AP1 and AP2. The removal of the sacrificial layers SAL may form first, second, and third inner regions IRG1, IRG3, and IRG3. For example, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring back to FIGS. 11A to 11C, a gate dielectric layer GI may be formed on the exposed first, second, and third semiconductor patterns SP1, SP2, and SP3. The gate dielectric layer GI may be formed to surround each of the first, second, and third semiconductor patterns SP1, SP2, and SP3. The gate dielectric layer GI may be formed in each of the first, second, and third inner regions IRG1, IRG2, and IRG3. The gate dielectric layer GI may also be formed in the outer region ORG.

Figure 13:
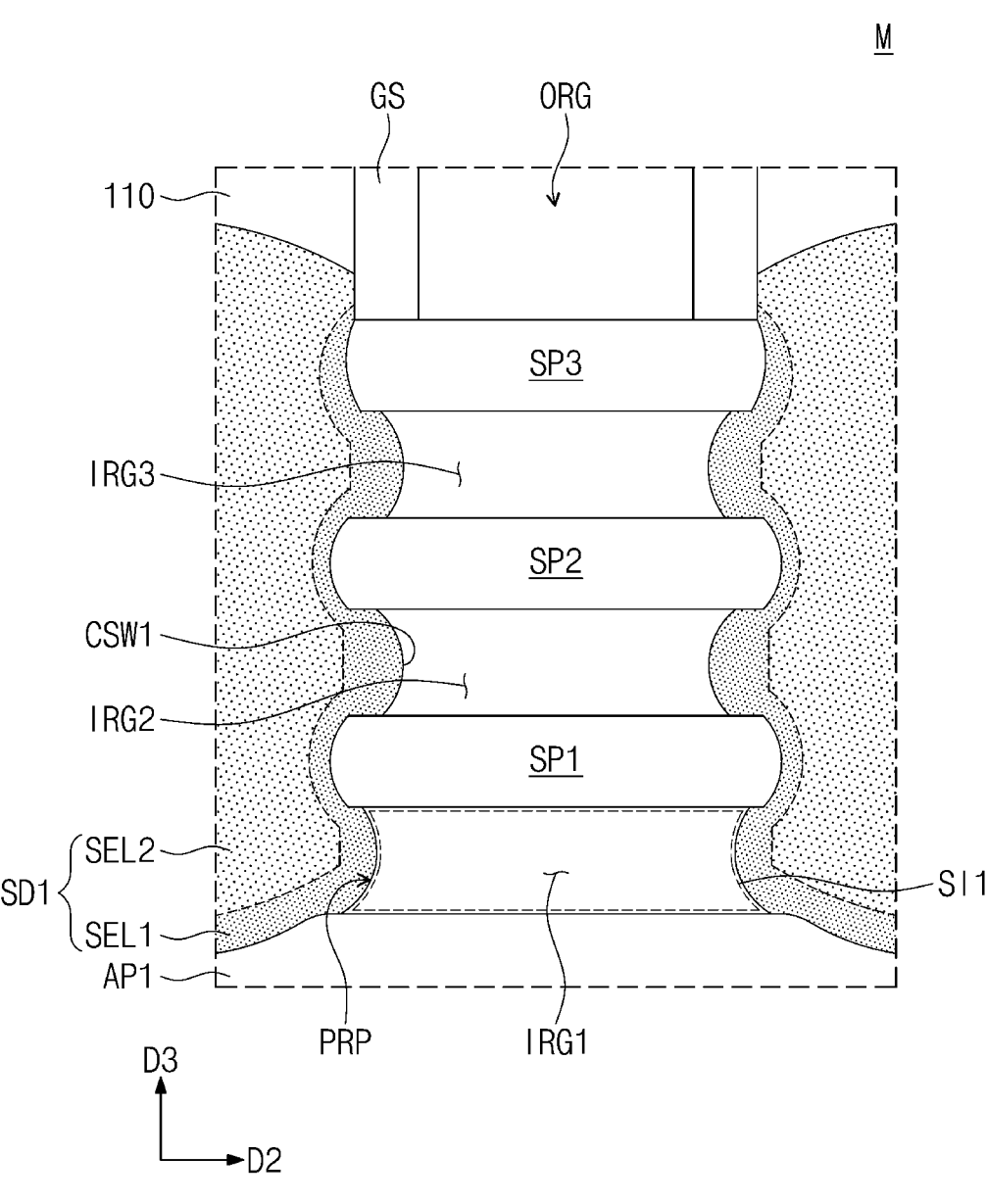
FIGS. 13 to 18 illustrate enlarged cross-sectional views showing a method of forming section M depicted in FIG. 11A.

FIGS. 13 to 18 illustrate enlarged cross-sectional views showing a method of forming section M depicted in FIG. 11A. Referring to FIG. 13, the sacrificial pattern PP may be selectively removed to form an outer region ORG. The sacrificial layers SAL exposed through the outer region ORG may be selectively removed to form first to third inner regions IRG1 to IRG3. Each of the first to third inner regions IRG1 to IRG3 may be positioned between a pair of first source/drain patterns SD1.

The indent region IDE depicted in FIG. 9A may allow the first source/drain pattern SD1 to include a protrusion PRP. The protrusion PRP may have a first sidewall CSW1. Representatively, the second inner region IRG2 may expose the first sidewall CSW1 of the first source/drain pattern SD1. The second inner region IRG2 may expose a top surface of the first semiconductor pattern SP1 and a bottom surface of the second semiconductor pattern SP2.

In some embodiments of the present inventive concepts, the first sidewall CSW1 of the first source/drain pattern SD1 may have a convex profile. A length (or width) in the second direction D2 of each of the first to third inner regions IRG1 to IRG3 may gradually decrease and then increase in the third direction D3. Each of the first to third inner regions IRG1 to IRG3 may have a first side SI1 that is concave to correspond to the first sidewall CSW1.

Figure 14:
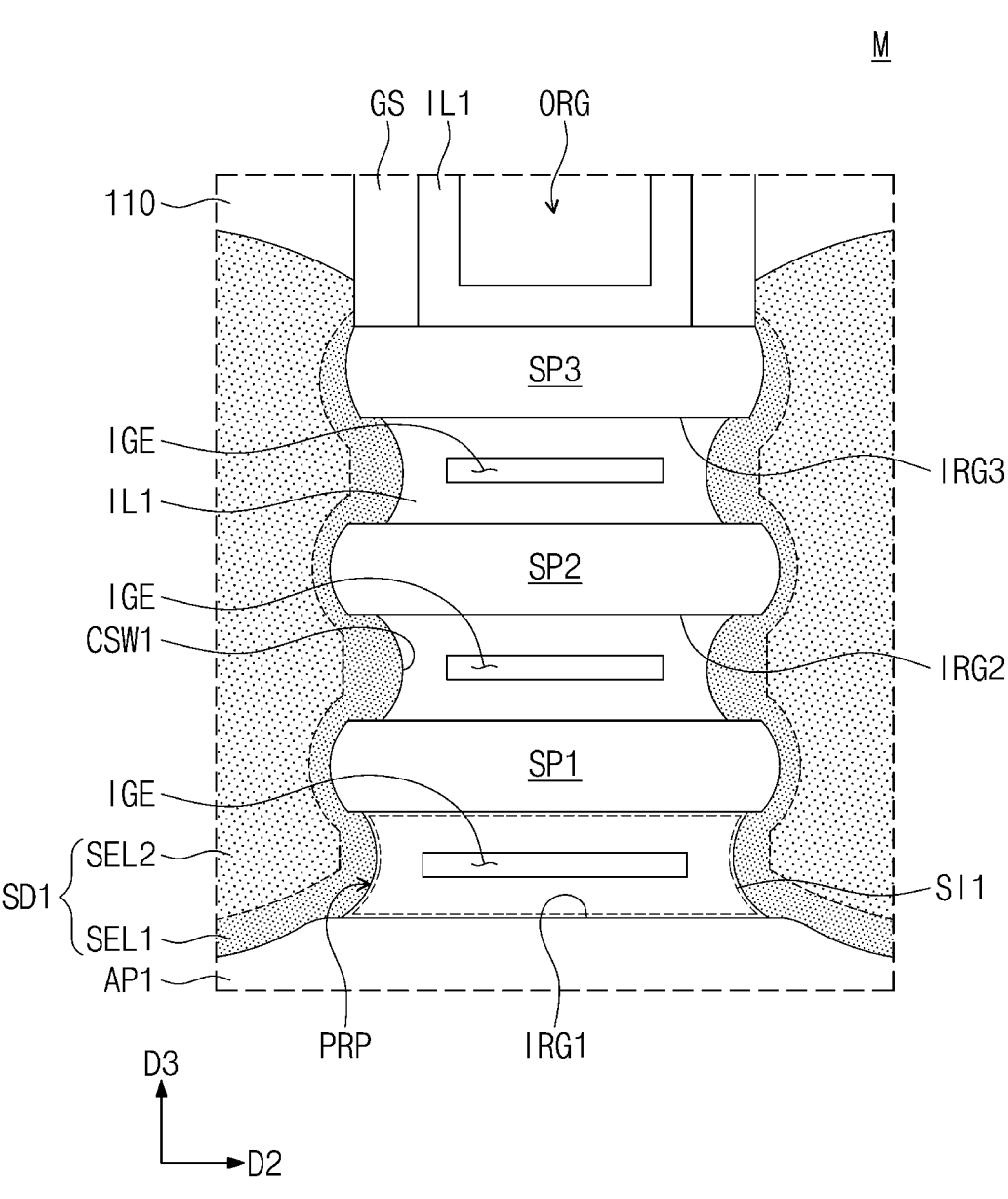

Referring to FIG. 14, a first process may be performed on the first to third inner regions IRG1 to IRG3 and the outer region ORG. The first process may include conformally depositing a first dielectric layer IL1. The first dielectric layer IL1 may be formed through a deposition process such as atomic layer deposition (ALD) or chemical vapor deposition (CVD). The first dielectric layer IL1 may be formed to partially fill a corresponding one of the first to third inner regions IRG1 to IRG3, without completely filling the corresponding one of the first to third inner regions IRG1 to IRG3. Therefore, each of the first to third inner regions IRG1 to IRG3 may have therein an inner gate space IGE surrounded by the first dielectric layer IL1. For example, the first dielectric layer IL1 may include or be a silicon oxide layer, a silicon oxynitride layer, or a silicon nitride layer.

Figure 15:
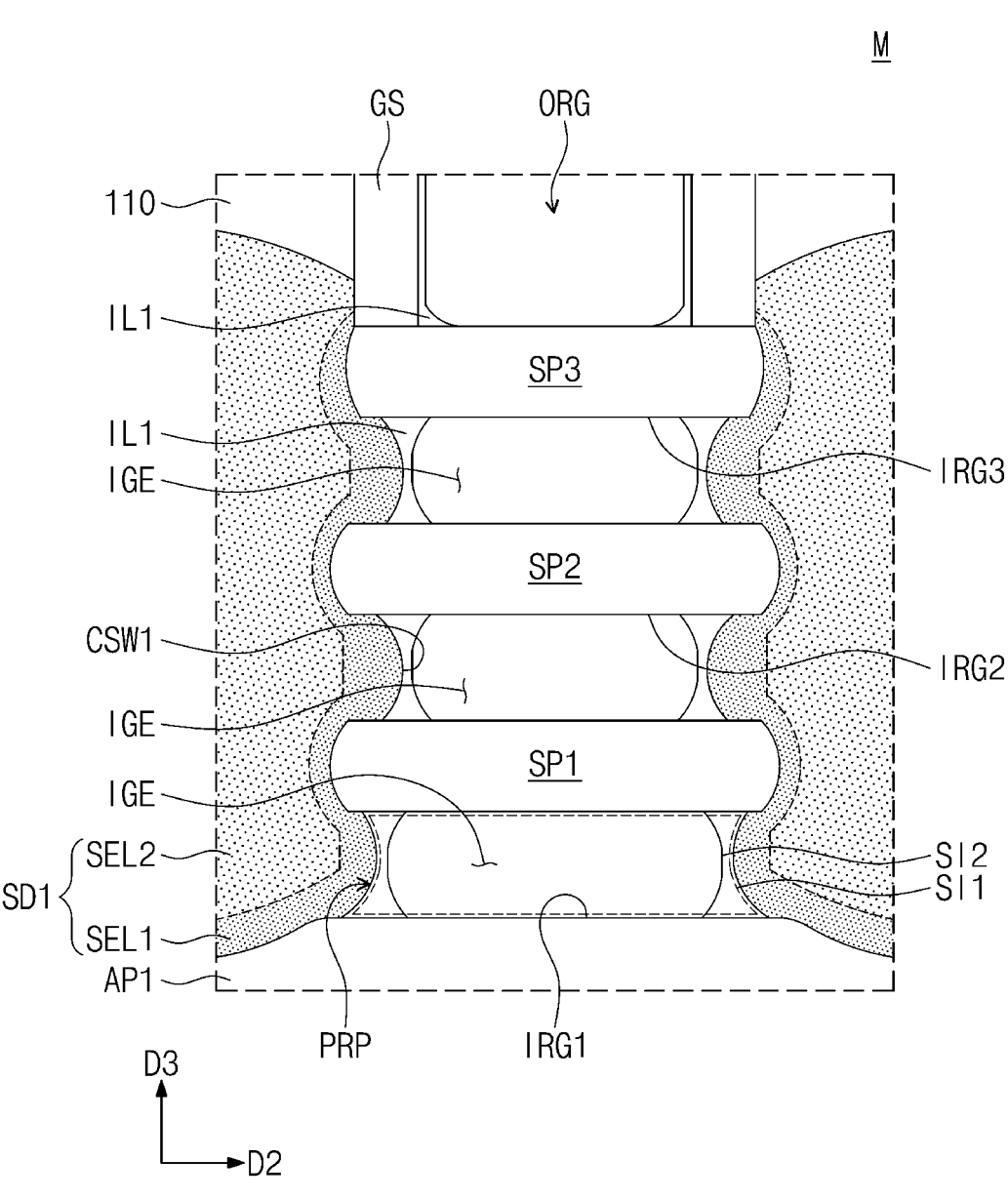

Referring to FIG. 15, a second process may be performed on the first to third inner regions IRG1 to IRG3 and the outer region ORG. The second process may include partially and selectively etching the first dielectric layer IL1. The second process may include a wet etching process using an etching solution that selectively etches only the first dielectric layer IL1. For example, an etching material may be provided through the inner gate space IGE to etch the first dielectric layer IL1. In some embodiments, the etching process may be performed until surfaces of the first, second, and third semiconductor patterns SP1, SP2, and SP3 are exposed.

After the etching process, the first dielectric layer IL1 may remain on a surface of the first source/drain pattern SD1. For example, a relatively large amount of the first dielectric layer IL1 may remain in a space between the first source/drain pattern SD1 and each of the first to third semiconductor patterns SP1 to SP3. The remaining first dielectric layer IL1 may provide an inner gate space IGE that is expanded compared to the inner gate space IGE depicted in FIG. 14. In some embodiments of the present inventive concepts, the inner gate space IGE may have a second side SI2 having a convex profile. For example, the second side SI2 of the inner gate space IGE may be rounded.

Figure 16:
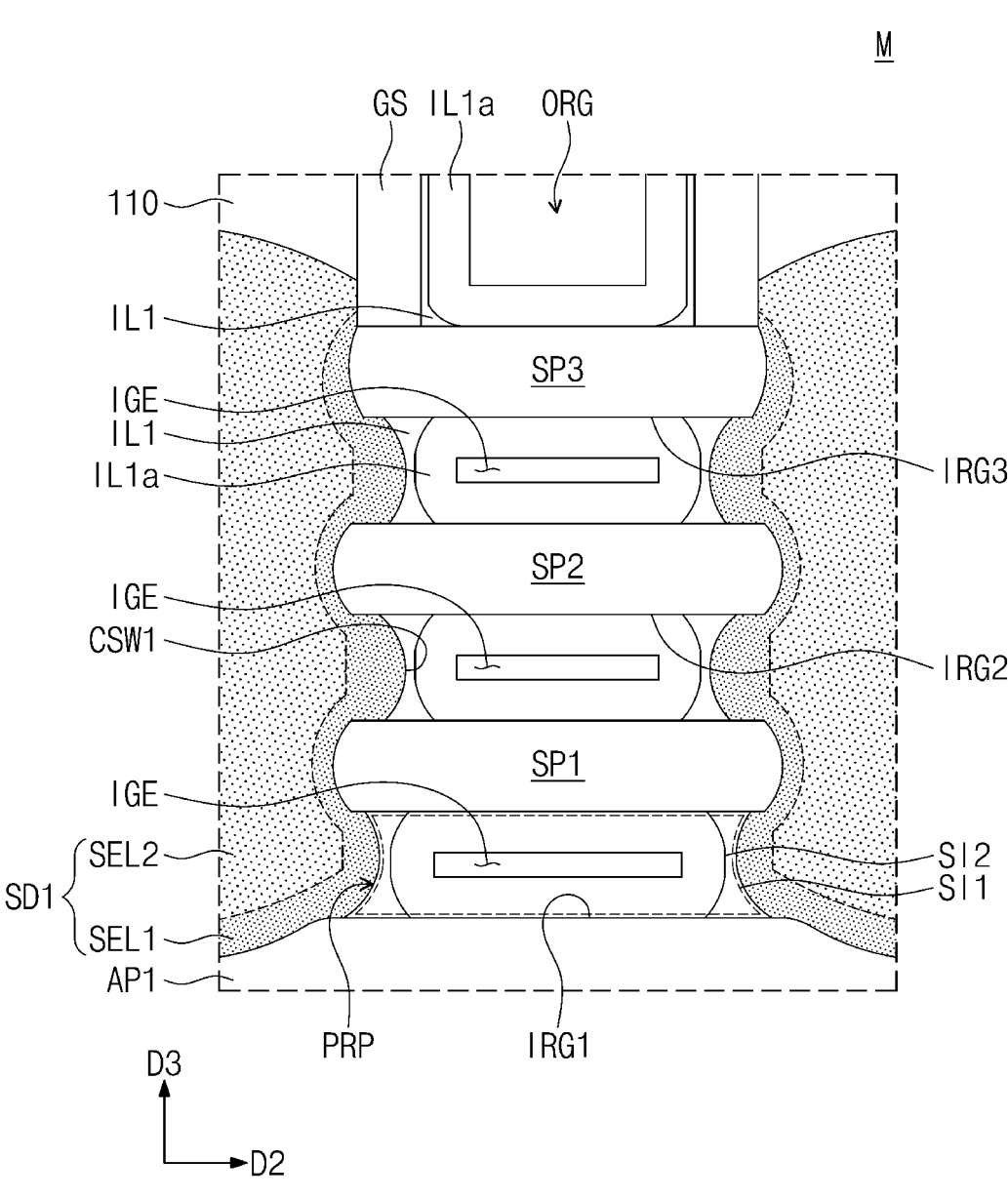

Referring to FIG. 16, the first process may be performed again on the first to third inner regions IRG1 to IRG3 and the outer region ORG. An additional first dielectric layer IL1a may be deposited on the first to third inner regions IRG1 to IRG3 and the outer region ORG. The additional first dielectric layer IL1a may cover the first dielectric layer IL1 that remains on the surface of the first source/drain pattern SD1. Each of the first to third inner regions IRG1 to IRG3 may have therein an inner gate space IGE surrounded by the additional first dielectric layer IL1a.

Figure 17:
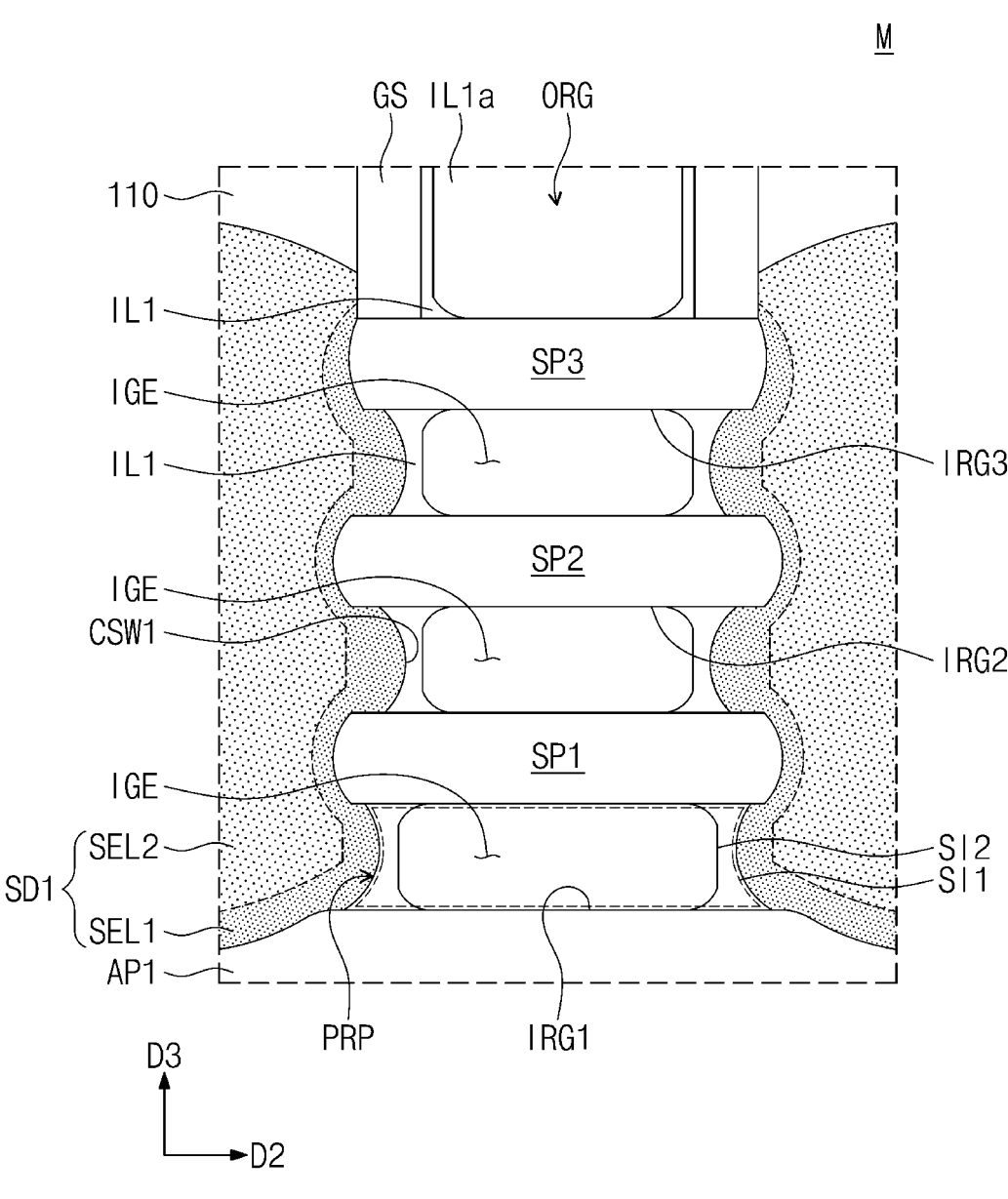

Referring to FIG. 17, the second process may be performed again on the first to third inner regions IRG1 to IRG3 and the outer region ORG. The second process may include a wet etching process that is performed until surfaces of the first, second, and third semiconductor patterns SP1, SP2, and SP3 are exposed.

After the etching process, the first dielectric layer IL1 may remain on the surface of the first source/drain pattern SD1. A horizontal thickness of the first dielectric layer IL1 depicted in FIG. 17 may be greater than that of the first dielectric layer IL1 depicted in FIG. 15. However, the second side SI2 of the inner gate space IGE depicted in FIG. 17 may have a profile that is flat rather than convex in the third direction D3. For example, each of the first and second processes may be performed again such that the second side SI2 of the inner gate space IGE may have a reduced curvature. The second side SI2 may have an increased radius of curvature.

The first process and the second process may constitute one cyclic process. According to some embodiments of the present inventive concepts, the cyclic process may be performed at least twice as discussed above with reference to FIGS. 13 to 17. The cyclic process may be repeatedly performed to allow the first dielectric layer IL1 to have an increased horizontal thickness and the second side SI2 of the inner gate space IGE to have a reduced curvature.

Figure 18:
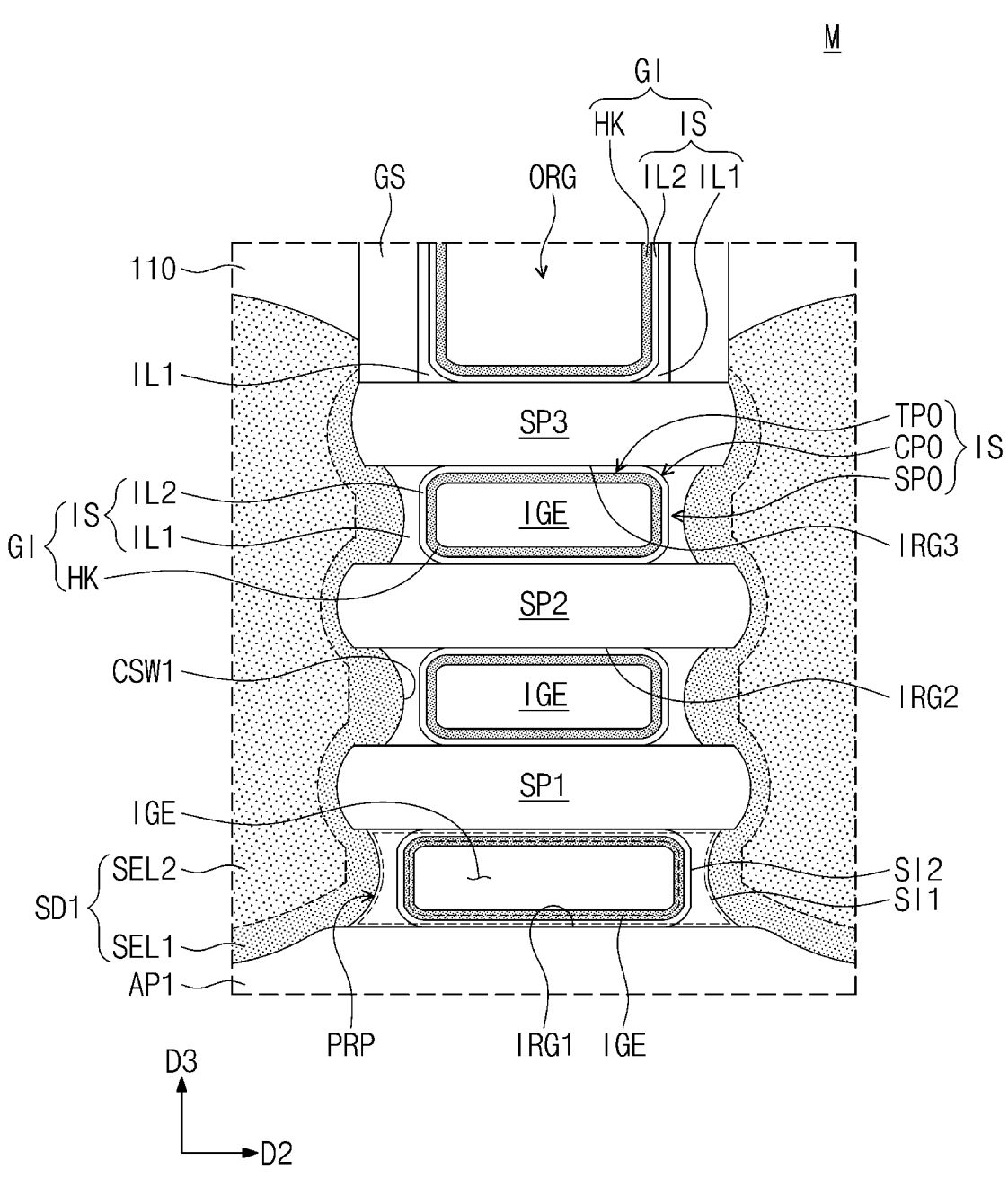

Referring to FIG. 18, a second dielectric layer IL2 may be conformally formed in the first to third inner regions IRG1 to IRG3 and the outer region ORG. The second dielectric layer IL2 may be formed on the first dielectric layer IL1. For example, the second dielectric layer IL2 may include or be a silicon oxide layer, a silicon oxynitride layer, or a silicon nitride layer. In some embodiments, the second dielectric layer IL2 may include the same material (e.g., silicon oxide) as that of the first dielectric layer IL1. The first dielectric layer IL1 and the second dielectric layer IL2 may constitute an inner spacer IS.

The inner spacer IS may include a first horizontal part TPO1 on a corresponding one of the first to third semiconductor patterns SP1 to SP3, a first vertical part SPO1 on the first sidewall CSW1 of the first source/drain pattern SD1, and a first corner part CPO1 between the first horizontal part TPO1 and the first vertical part SPO1. The first corner part CPO1 may have a thickness (see TK3 of FIG. 6A) greater than that (see TK1 of FIG. 6A) of the first horizontal part TPO1. The first vertical part SPO1 may have a thickness (see TK2 of FIG. 6A) greater than that (see TK3 of FIG. 6A) of the first corner part CPO1.

The inner spacer IS in each of the first to third inner regions IRG1 to IRG3 may define an inner gate space IGE. Each of the first to third inner regions IRG1 to IRG3 may have a concave first side SI1, and the inner gate space IGE may have a convex second side SI2. The second side SI2 according to the present inventive concepts may include a part that vertically extends in the third direction D3.

A high-k dielectric layer HK may be formed in the outer region ORG and the first to third inner regions IRG1 to IRG3. The high-k dielectric layer HK may be formed in the inner gate space IGE. The inner spacer IS and the high-k dielectric layer HK may constitute a gate dielectric layer GI. In some embodiments of the present inventive concepts, the high-k dielectric layer HK may be conformally formed. For example, a thickness in a horizontal direction of the high-k dielectric layer HK may be substantially the same as a thickness in a vertical direction of the high-k dielectric layer HK.

According to the present inventive concepts, as the first horizontal part TPO1 of the inner spacer IS has a relatively small thickness (see TK1 of FIG. 6A), each of the first to third inner regions IRG1, IRG2, and IRG3 may have therein the inner gate space IGE or a space that is sufficiently filled with the gate electrode GE. In the present inventive concepts, the first vertical part SPO1 may be formed to have a relatively large thickness (see TK2 of FIG. 6A), and thus a transistor may decrease in leakage current and increase in electrical properties.

Figure 12A:
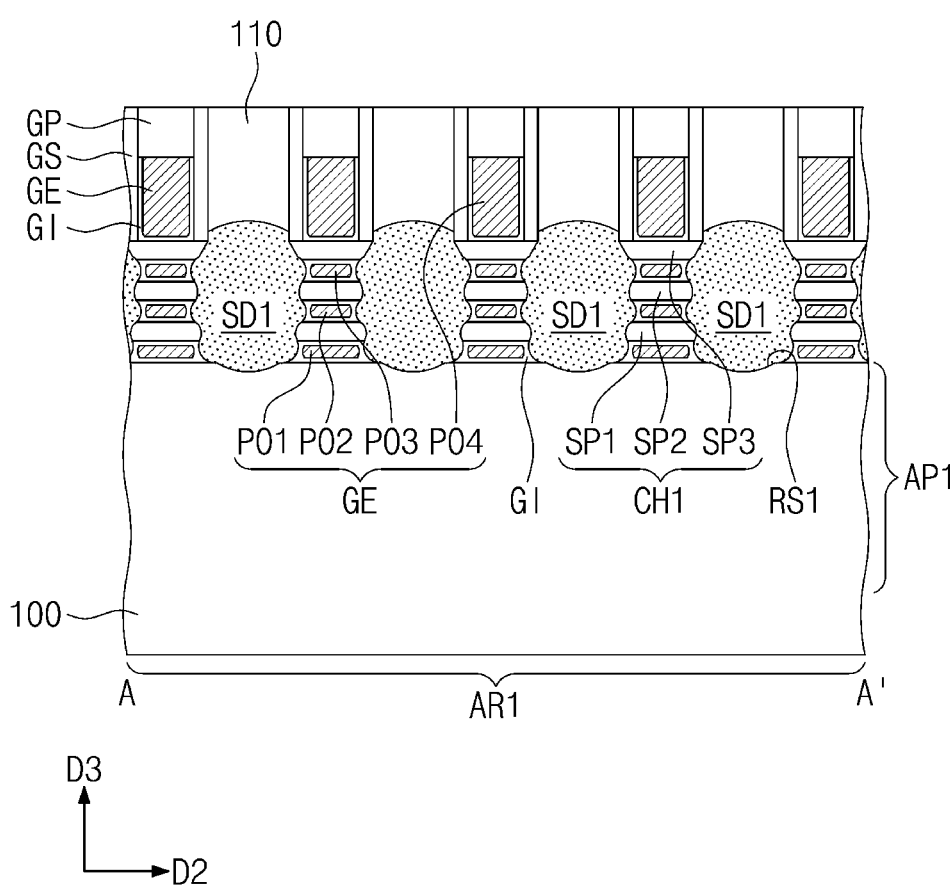
Figure 12B:
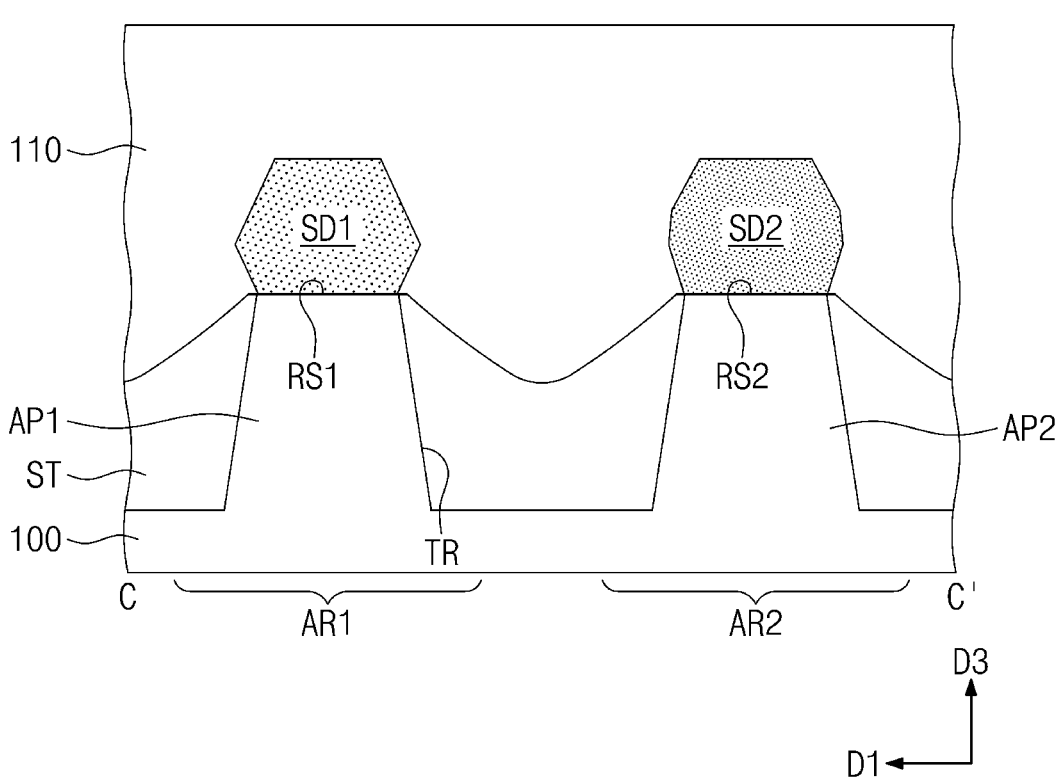
Figure 12C:
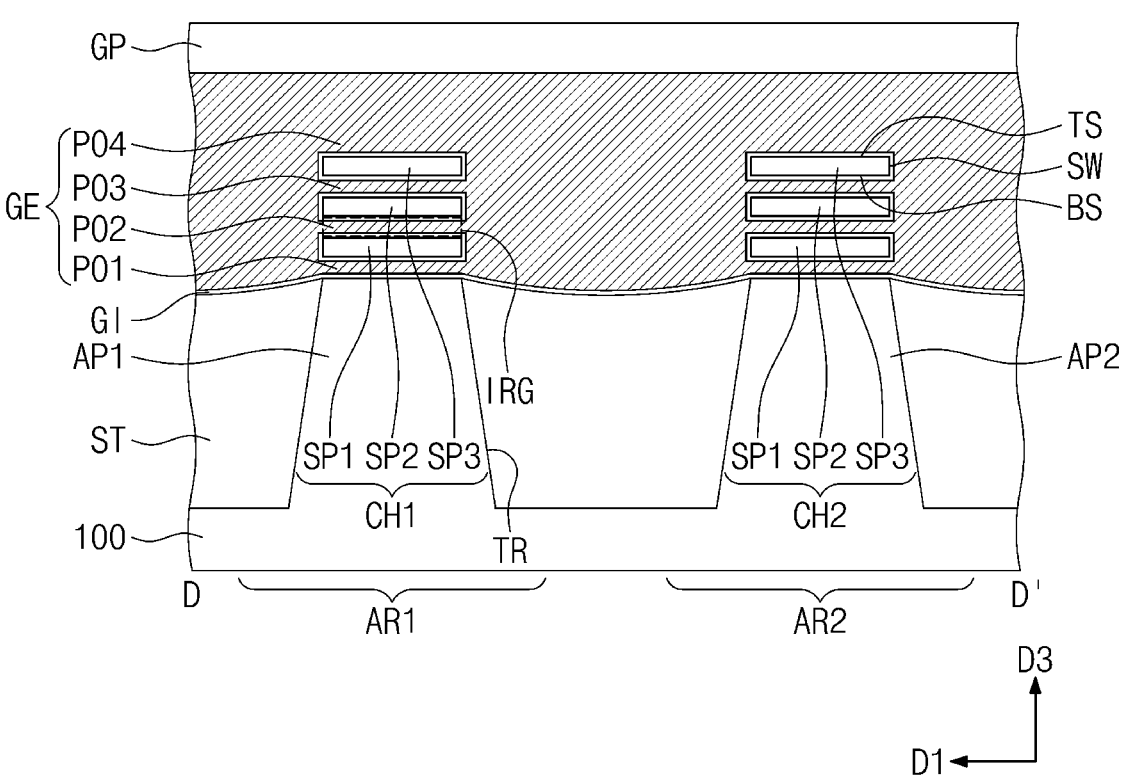

Referring to FIGS. 12A to 12C, a gate electrode GE may be formed on the gate dielectric layer GI. The gate electrode GE may include first, second, and third inner electrodes PO1, PO2, and PO3 that are respectively formed in the first, second, and third inner regions IRG1, IRG2, and IRG3, and may also include an outer electrode PO4 formed in the outer region ORG. Each of the first, second, and third inner electrodes PO1, PO2, and PO3 may fill the inner gate space IGE of FIG. 18. The gate electrode GE may be recessed to have a reduced height. A gate capping pattern GP may be formed on the recessed gate electrode GE.

Referring back to FIGS. 5A to 5D, a second interlayer dielectric layer 120 may be formed on the first interlayer dielectric layer 110. The second interlayer dielectric layer 120 may include or be a silicon oxide layer. Active contacts AC may be formed to penetrate the second and first interlayer dielectric layers 120 and 110 to come into electrical connection with the first and second source/drain patterns SD1 and SD2. A gate contact GC may be formed to penetrate the second interlayer dielectric layer 120 and the gate capping pattern GP to come into electrical connection with the gate electrode GE.

The formation of each of the active contact AC and the gate contact GC may include forming a barrier pattern BM and forming a conductive pattern FM on the barrier pattern BM. The barrier pattern BM may be conformally formed and may include a metal layer and a metal nitride layer. The conductive patterns FM may include metal whose resistance is low.

Separation structures DB may be correspondingly formed on first and second boundaries BD1 and BD2 of the single height cell SHC. The separation structure DB may penetrate the gate capping pattern GP and the gate electrode GE to extend into the active pattern AP1 or AP2. The separation structure DB may include or be formed of a dielectric material, such as a silicon oxide layer or a silicon nitride layer.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

The following will describe various embodiments. In the embodiment that follows, a detailed description of technical features repetitive to those discussed with reference to FIGS. 1 to 6A will be omitted, and a difference thereof will be discussed in detail.

Figure 19:
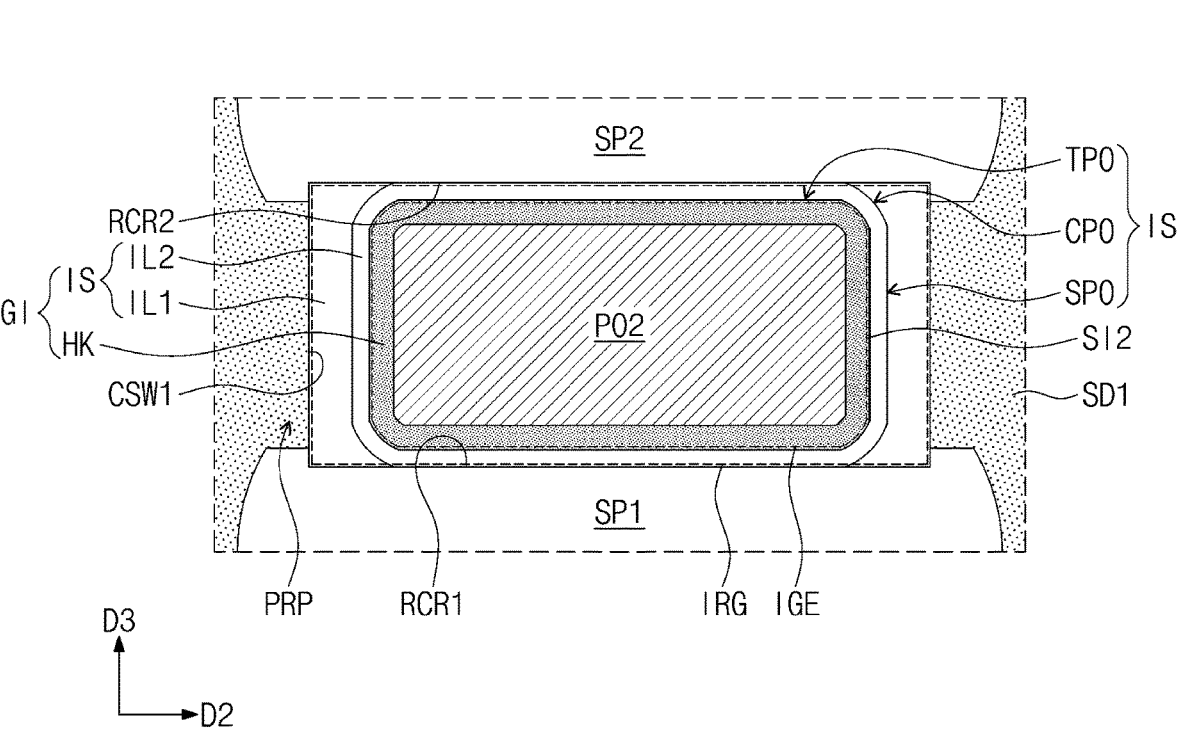
FIGS. 19, 20, and 21 illustrate enlarged cross-sectional views showing a second inner electrode and a gate dielectric layer of FIG. 6A.
Figure 20:
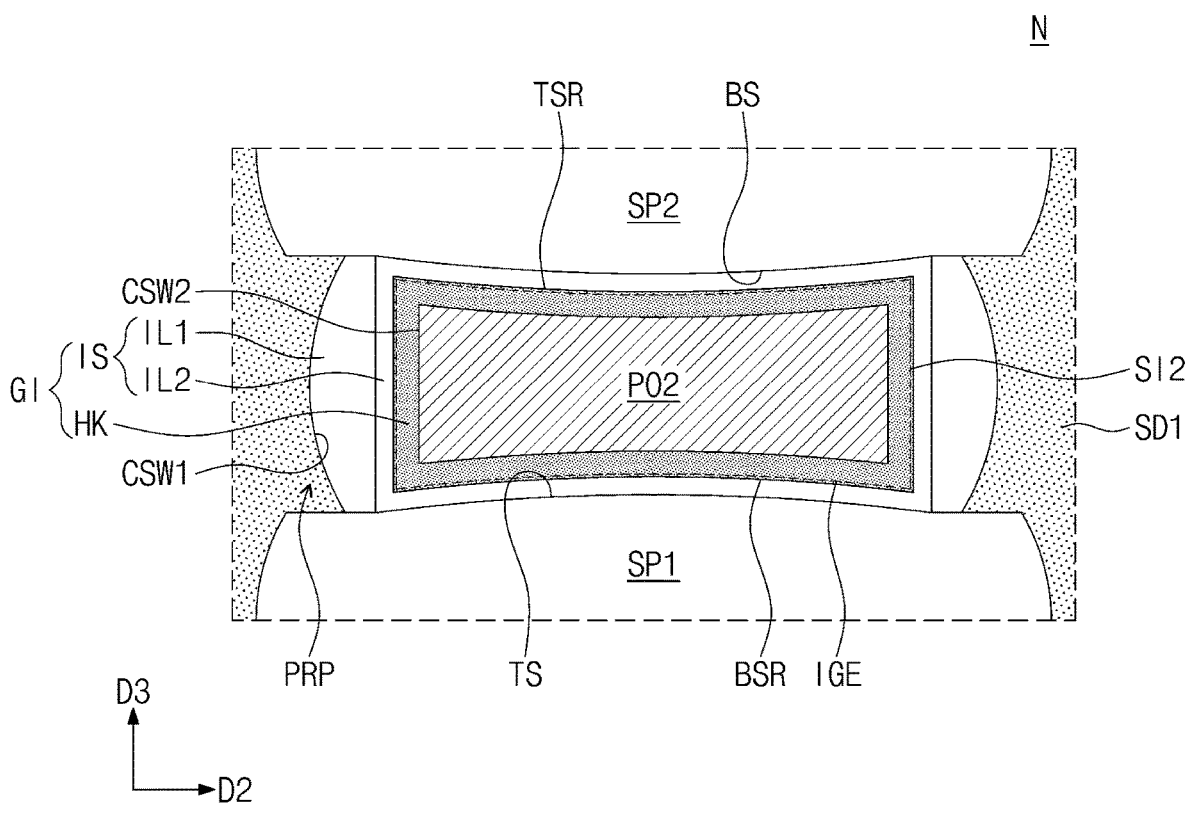
Figure 21:
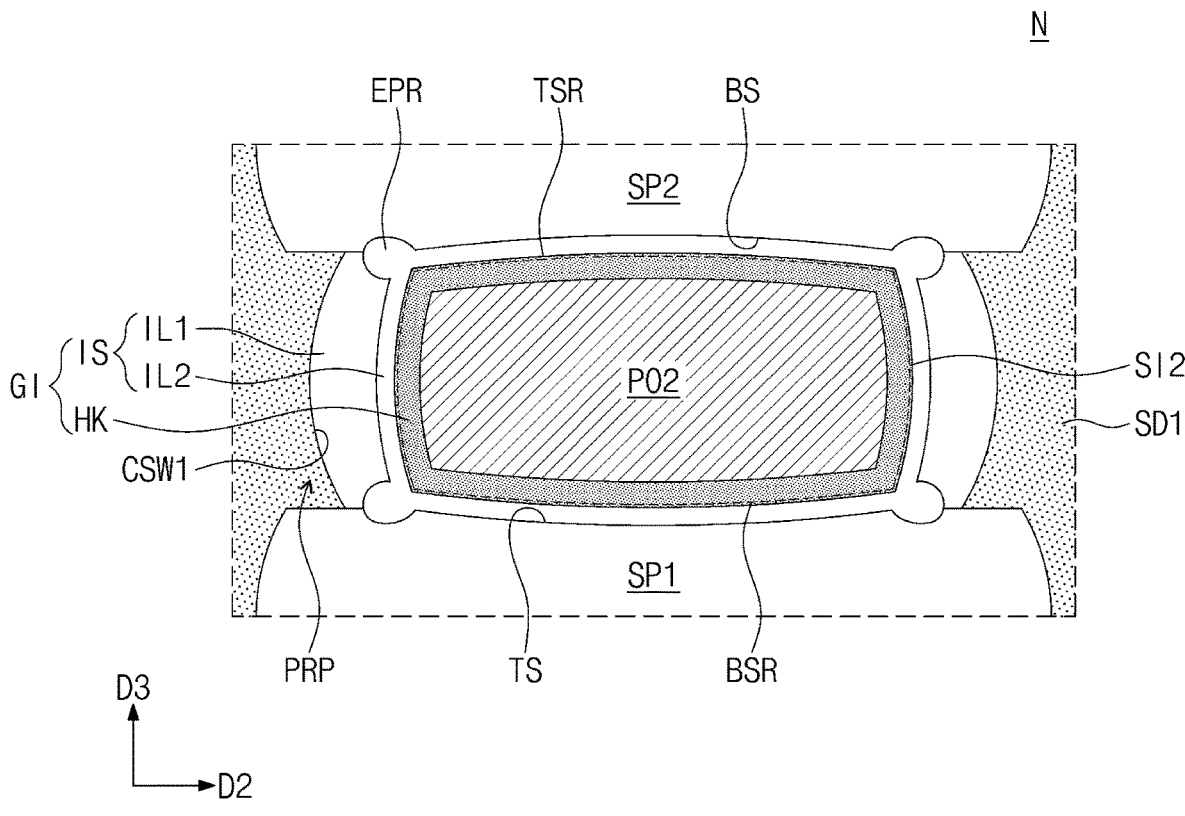

FIGS. 19, 20, and 21 illustrate enlarged cross-sectional views showing a second inner electrode and a gate dielectric layer of FIG. 6A. Referring to FIG. 19, the first sidewall CSW1 of the protrusion PRP included in the first source/drain pattern SD1 may have a flat profile parallel to the third direction D3. A first recess region RCR1 may be formed on a top surface of the first semiconductor pattern SP1, and a second recess region RCR2 may be formed on a bottom surface of the second semiconductor pattern SP2. The inner region IRG may be defined between the first recess region RCR1 and the second recess region RCR2 and between a pair of first source/drain patterns SD1.

The gate dielectric layer GI and the second inner electrode PO2 may be provided in the inner region IRG. The gate dielectric layer GI may include the inner spacer IS and the high-k dielectric layer HK. The inner spacer IS may include a first horizontal part TPO, a first vertical part SPO, and a first corner part CPO that connects the first horizontal part TPO to the first vertical part SPO.

The inner spacer IS may partially fill the inner region IRG. The inner spacer IS may provide the inner gate space IGE. The second side SI2 of the inner gate space IGE may have a flat profile parallel to the third direction D3.

Referring to FIG. 20, a concave profile may be given to the first sidewall CSW1 of the protrusion PRP included in the first source/drain pattern SD1. The top surface TS of the first semiconductor pattern SP1 may have a convex profile. The bottom surface BS of the second semiconductor pattern SP2 may have a convex profile. The inner spacer IS may directly cover the first sidewall CSW1 of the first source/drain pattern SD1, the top surface TS of the first semiconductor pattern SP1, and the bottom surface BS of the second semiconductor pattern SP2.

The inner spacer IS may define the inner gate space IGE. The inner gate space IGE may have a ribbon shape or a lying hourglass shape. The second side SI2 of the inner gate space IGE may have a flat profile parallel to the third direction D3. The high-k dielectric layer HK and the second inner electrode PO2 may be provided in the inner gate space IGE.

Referring to FIG. 21, a concave profile may be given to the first sidewall CSW1 of the protrusion PRP included in the first source/drain pattern SD1. The top surface TS of the first semiconductor pattern SP1 may have a downwardly concave profile. The bottom surface BS of the second semiconductor pattern SP2 may have an upwardly concave profile. The inner spacer IS may directly cover the first sidewall CSW1 of the first source/drain pattern SD1, the top surface TS of the first semiconductor pattern SP1, and the bottom surface BS of the second semiconductor pattern SP2.

The second dielectric layer IL2 may include an edge protrusion EPR provided at each corner thereof. The edge protrusion EPR may protrude toward the first dielectric layer IL1 and the semiconductor pattern SP1 or SP2. The inner spacer IS may define the inner gate space IGE. A length in the third direction D3 of the inner gate space IGE may gradually increase and then decrease in a direction from the first source/drain pattern SD1 on one side thereof toward the first source/drain pattern SD1 on another side thereof. The second side SI2 of the inner gate space IGE may have a convex profile. For example, the inner gate space IGE may have an oval shape. The high-k dielectric layer HK and the second inner electrode PO2 may be provided in the inner gate space IGE.

In a three-dimensional field effect transistor according to the present inventive concepts, a gate dielectric layer may include an inner spacer capable of preventing a gate leakage current. A side of the inner spacer may have an increased thickness, and horizontal and corner parts of the inner spacer may each have a minimum thickness, which may provide a sufficient inner gate space. Therefore, the inner gate space may be stably filled with a gate electrode. As a result, a semiconductor device according to the present inventive concepts may increase in electrical properties.

Although some embodiments of inventive concepts have been discussed with reference to accompanying figures, it will be understood that various changes in form and details may be made therein without departing from the spirit and scope of inventive concepts. It therefore will be understood that the embodiments described above are just illustrative but not limitative in all aspects.

Terms such as "same," "equal," "planar," or "coplanar," as used herein when referring to orientation, layout, location, shapes, sizes, compositions, amounts, or other measures do not necessarily mean an exactly identical orientation, layout, location, shape, size, composition, amount, or other measure, but are intended to encompass nearly identical orientation, layout, location, shapes, sizes, compositions, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

What is claimed is:

1. A semiconductor device, comprising:
a substrate that includes an active pattern;
a channel pattern on the active pattern, wherein the channel pattern includes a plurality of semiconductor patterns that are spaced apart from and vertically stacked on each other;
a source/drain pattern connected to the plurality of semiconductor patterns;
a gate electrode on the plurality of semiconductor patterns; and
a gate dielectric layer between the gate electrode and the plurality of semiconductor patterns,
wherein the gate electrode includes an inner electrode between a first semiconductor pattern and a second semiconductor pattern that are adjacent ones of the plurality of semiconductor patterns,
wherein the gate dielectric layer includes:
a high-k dielectric layer that surrounds the inner electrode of the gate electrode; and
an inner spacer on the high-k dielectric layer,
wherein the inner spacer defines an inner gate space therein,
wherein the high-k dielectric layer and the inner electrode are provided in the inner gate space,
wherein the inner spacer includes:
a first horizontal part between the high-k dielectric layer and the second semiconductor pattern;
a first vertical part between the high-k dielectric layer and the source/drain pattern; and
a first corner part that connects the first horizontal part to the first vertical part,
wherein the first horizontal part has a first thickness in a vertical direction,
wherein the first corner part has a second thickness in the vertical direction,
wherein a ratio of the second thickness to the first thickness is in a range of about 1.1:1 to about 1.5:1.

2. The semiconductor device of claim 1, wherein a thickness of the first corner part in a direction perpendicular to an inner surface of the inner spacer is greater than the first thickness.

3. The semiconductor device of claim 2, wherein the thickness of the first corner part in a direction perpendicular to the inner surface of the inner spacer is 2 to 5 times the first thickness and is greater than the second thickness.

4. The semiconductor device of claim 1, wherein:
the first vertical part has a third thickness in a horizontal direction, and
a ratio of the third thickness to the first thickness is in a range of about 2.5:1 to about 5:1.

5. The semiconductor device of claim 1, wherein:
the source/drain pattern includes a protrusion that protrudes toward the inner electrode,
a sidewall of the protrusion has a profile that is convex toward the inner electrode, and
a side of the inner gate space adjacent to the sidewall of the protrusion has a flat profile parallel to the vertical direction.

6. The semiconductor device of claim 1, wherein:
a first recess region is disposed on a top surface of the first semiconductor pattern,
a second recess region is disposed on a bottom surface of the second semiconductor pattern, and
the inner spacer directly covers the first recess region and the second recess region.

7. The semiconductor device of claim 1, wherein:
the inner spacer includes a first dielectric layer and a second dielectric layer,
the first dielectric layer includes a silicon oxide layer, and
the second dielectric layer includes a silicon nitride layer or a silicon oxynitride layer.

8. The semiconductor device of claim 1, wherein the inner spacer directly covers the first semiconductor pattern, the second semiconductor pattern, and the source/drain pattern.

9. The semiconductor device of claim 1, further comprising a gate spacer on a sidewall of the gate electrode,
wherein the gate electrode further includes an outer electrode on an uppermost one of the plurality of semiconductor patterns, and
wherein the inner spacer includes:
a second horizontal part between the outer electrode and the uppermost semiconductor pattern;
a second vertical part between the outer electrode and the gate spacer; and
a second corner part between the second horizontal part and the second vertical part.

10. The semiconductor device of claim 9, wherein:
the second corner part has a third thickness in the vertical direction, and
the third thickness is the same as or less than the second thickness.

11. A semiconductor device, comprising:
a substrate that includes an active pattern;
a channel pattern on the active pattern, wherein the channel pattern includes a plurality of semiconductor patterns that are spaced apart from and vertically stacked on each other;
a first source/drain pattern and a second source/drain pattern on opposite sides of the channel pattern;
a gate electrode on the channel pattern; and
a gate dielectric layer between the channel pattern and the gate electrode,
wherein an inner region is defined between the first source/drain pattern and the second source/drain pattern and between a first semiconductor pattern and a second semiconductor pattern that are adjacent ones of the plurality of semiconductor patterns,
wherein the gate dielectric layer includes:
an inner spacer that partially fills the inner region and defines an inner gate space in the inner spacer; and
an air gap at a corner part of the inner spacer,
wherein the gate electrode includes an inner electrode in the inner gate space.

12. The semiconductor device of claim 11, wherein the inner spacer includes:
a horizontal part between the inner electrode and the second semiconductor pattern; and
a vertical part between the inner electrode and the second source/drain pattern,
wherein the corner part connects the horizontal part to the vertical part.

13. The semiconductor device of claim 12, wherein:
the horizontal part has a first thickness in a vertical direction, the corner part combined with the air gap has a second thickness in the vertical direction, and
a ratio of the second thickness to the first thickness is in a range of about 1.1:1 to about 1.5:1.

14. The semiconductor device of claim 12, wherein:
the horizontal part has a first thickness in a vertical direction,
the vertical part has a second thickness in a horizontal direction, and
a ratio of the second thickness to the first thickness is in a range of about 2.5:1 to about 5:1.

15. The semiconductor device of claim 12, wherein the air gap is between the horizontal part and the vertical part.

16. A semiconductor device, comprising:
a substrate that includes an active pattern;
a device isolation layer that defines the active pattern;
a channel pattern and a source/drain pattern on the active pattern, the channel pattern including a plurality of semiconductor patterns that are spaced apart from each other and vertically stacked on each other;
a gate electrode on the plurality of semiconductor patterns;
a gate dielectric layer between the gate electrode and the plurality of semiconductor patterns;
a gate spacer on a sidewall of the gate electrode;
a gate capping pattern on a top surface of the gate electrode;
an interlayer dielectric layer on the gate capping pattern;
an active contact that penetrates the interlayer dielectric layer and is electrically connected to the source/drain pattern;
a metal-semiconductor compound layer between the active contact and the source/drain pattern;
a gate contact that penetrates the interlayer dielectric layer and the gate capping pattern and is electrically connected to the gate electrode; and
a first metal layer on the interlayer dielectric layer,
wherein the first metal layer includes:
a power line; and
a plurality of first wiring lines electrically connected to the active contact and the gate contact,
wherein the gate electrode includes an inner electrode between a first semiconductor pattern and a second semiconductor pattern that are adjacent ones of the plurality of semiconductor patterns,
wherein the source/drain pattern includes a protrusion that protrudes toward the inner electrode,
wherein the gate dielectric layer includes:
a high-k dielectric layer that surrounds the inner electrode of the gate electrode; and
an inner spacer on the high-k dielectric layer,
wherein the inner spacer includes:
a horizontal part between the high-k dielectric layer and the second semiconductor pattern;
a vertical part between the high-k dielectric layer and the protrusion; and
a corner part that connects the horizontal part to the vertical part,
wherein a first side of the vertical part has a concave profile that corresponds to the protrusion, and
wherein a second side of the vertical part has a flat profile parallel to a vertical direction.

17. The semiconductor device of claim 16, wherein:
the horizontal part has a first thickness in the vertical direction,
the corner part has a second thickness in the vertical direction, and a ratio of the second thickness to the first thickness is in a range of about 1.1:1 to about 1.5:1.

18. The semiconductor device of claim 16, wherein:

the horizontal part has a first thickness in the vertical direction, the vertical part has a second thickness in a horizontal direction, and a ratio of the second thickness to the first thickness is in a range of about 2.5:1 to about 5:1.

19. The semiconductor device of claim 16, wherein the gate dielectric layer further includes an air gap defined at the corner part.

20. The semiconductor device of claim 16, wherein the inner spacer directly covers the first and second semiconductor patterns and the protrusion.

* * * * *